US012444609B2

(12) United States Patent
Seddon et al.

(10) Patent No.: US 12,444,609 B2
(45) Date of Patent: Oct. 14, 2025

(54) SILICON-ON-INSULATOR DIE SUPPORT STRUCTURES AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US); Eiji Kurose, Oizumi-machi (JP); Chee Hiong Chew, Seremban (MY); Soon Wei Wang, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 451 days.

(21) Appl. No.: 17/806,144

(22) Filed: Jun. 9, 2022

(65) Prior Publication Data
US 2022/0301876 A1    Sep. 22, 2022

Related U.S. Application Data

(60) Division of application No. 16/861,810, filed on Apr. 29, 2020, now Pat. No. 11,361,970, which is a
(Continued)

(51) Int. Cl.
H01L 23/00    (2006.01)
H01L 21/302    (2006.01)
(Continued)

(52) U.S. Cl.
CPC ............ H01L 21/302 (2013.01); H01L 21/48 (2013.01); H01L 21/561 (2013.01);
(Continued)

(58) Field of Classification Search
CPC ..................................................... H01L 24/96
See application file for complete search history.

(56) References Cited

U.S. PATENT DOCUMENTS 6,319,796 B1    11/2001    Aparra et al.
9,165,886 B2    10/2015    Bowles et al.
(Continued)

FOREIGN PATENT DOCUMENTS

CN    101552248 A    10/2009
CN    104201114 A    12/2014

OTHER PUBLICATIONS

Extended European Search Report, European Patent Application No. 18184165.1, Jan. 17, 2019, 8 pages.
(Continued)

Primary Examiner — Christopher A Johnson
(74) Attorney, Agent, or Firm — IPTechLaw

(57) ABSTRACT

Implementations of a silicon-in-insulator (SOI) semiconductor die may include a first largest planar surface, a second largest planar surface and a thickness between the first largest planar surface and the second largest planar surface; and one of a permanent die support structure, a temporary die support structure, or any combination thereof coupled to one of the first largest planar surface, the second largest planar surface, the thickness, or any combination thereof. The first largest planar surface, the second largest planar surface, and the thickness may be included through a silicon layer coupled to a insulative layer.

11 Claims, 22 Drawing Sheets

Related U.S. Application Data continuation-in-part of application No. 16/702,958, filed on Dec. 4, 2019, now Pat. No. 11,328,930, and a continuation-in-part of application No. 16/395,822, filed on Apr. 26, 2019, now Pat. No. 10,763,173, and a continuation-in-part of application No. 15/961,642, filed on Apr. 24, 2018, now Pat. No. 10,741,487, said application No. 16/702,958 is a division of application No. 15/679,661, filed on Aug. 17, 2017, now Pat. No. 10,529,576, said application No. 16/395,822 is a continuation of application No. 15/679,664, filed on Aug. 17, 2017, now Pat. No. 10,319,639.

(51) Int. Cl.
*H01L 21/48* (2006.01)
*H01L 21/56* (2006.01)
*H01L 21/78* (2006.01)
*H01L 23/12* (2006.01)
*H01L 23/31* (2006.01)

(52) U.S. Cl.
CPC ............ *H01L 21/565* (2013.01); *H01L 21/78* (2013.01); *H01L 23/12* (2013.01); *H01L 23/3185* (2013.01); *H01L 24/04* (2013.01); *H01L 24/26* (2013.01); *H01L 2224/94* (2013.01)

(56) References Cited

U.S. PATENT DOCUMENTS

| | | | |
|---|---|---|---|
| 9,496,193 B1 | 11/2016 | Roesner et al. | |
| 9,653,383 B2 | 5/2017 | Yilmaz et al. | |
| 10,319,639 B2 | 6/2019 | Krishnan et al. | |
| 11,404,276 B2* | 8/2022 | Carney | H01L 23/12 |
| 11,437,291 B2* | 9/2022 | Carney | H01L 23/31 |
| 2004/0192006 A1 | 9/2004 | Campbell et al. | |
| 2006/0017154 A1* | 1/2006 | Eguchi | H01L 27/1266 |
| | | | 438/459 |
| 2006/0057782 A1 | 3/2006 | Gardes et al. | |
| 2006/0091396 A1 | 5/2006 | Lee et al. | |
| 2007/0087544 A1 | 4/2007 | Chang et al. | |
| 2008/0014677 A1* | 1/2008 | Xiaochun | H01L 24/96 |
| | | | 438/106 |
| 2008/0227240 A1 | 9/2008 | Sharma et al. | |
| 2008/0242052 A1 | 10/2008 | Feng et al. | |
| 2008/0251902 A1 | 10/2008 | Masuda et al. | |
| 2009/0215227 A1 | 8/2009 | Tan et al. | |
| 2011/0175242 A1 | 7/2011 | Grivna et al. | |
| 2012/0104580 A1 | 5/2012 | Feng et al. | |
| 2013/0344652 A1 | 12/2013 | Haba et al. | |
| 2014/0138856 A1* | 5/2014 | Sekiguchi | C03C 25/26 |
| | | | 442/64 |
| 2014/0217556 A1 | 8/2014 | Peh et al. | |
| 2014/0264802 A1 | 9/2014 | Yilmaz et al. | |
| 2015/0179552 A1 | 6/2015 | Myung et al. | |
| 2015/0364376 A1 | 12/2015 | Yu et al. | |
| 2016/0225733 A1 | 8/2016 | Wilcoxen | |
| 2016/0254415 A1 | 9/2016 | Kaempf et al. | |
| 2017/0032981 A1 | 2/2017 | Chinnusamy | |
| 2017/0033026 A1 | 2/2017 | Ho et al. | |
| 2017/0047294 A1* | 2/2017 | Chang | H01L 24/97 |
| 2017/0098612 A1 | 4/2017 | Lin et al. | |
| 2017/0236765 A1 | 8/2017 | Tamagawa et al. | |
| 2017/0243846 A1 | 8/2017 | Chen et al. | |
| 2018/0033739 A1 | 2/2018 | Seddon | |
| 2018/0166396 A1 | 6/2018 | Lee et al. | |
| 2020/0161242 A1 | 5/2020 | Lin et al. | |

OTHER PUBLICATIONS

Insulating Film Ajinomoto Build-Up Film, Ajinomoto Fine-TechnoCo., Inc., available at https:www.aft-website.com/en/electron/abf. Last vivisted Jul. 14, 2017.

JCAP Sidewall Isolated 0201/01005 DSN, Slide from JCAP, available at least as early as Jun. 22, 2017.

Sumitomo Bakelite Co., Ltd., Sumikon—EME-G600, Product Specification Sheet, Nov. 2005, 1 page.

Sumitomo Bakelite Co., Ltd., Sumikon—EME-G770H Type CD, Product Specification Sheet, May 2007, 1 page.

Silicon on insulator, Wikipedia, available at https://en.wikipedia.org/wiki/Silicon_on_insulator. Accessed on Mar. 22, 2018.

* cited by examiner

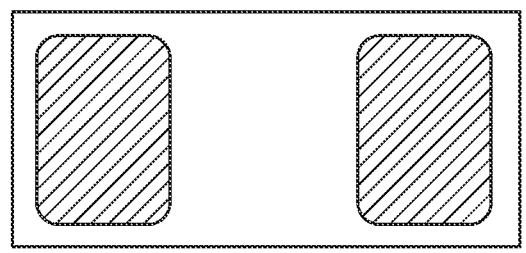
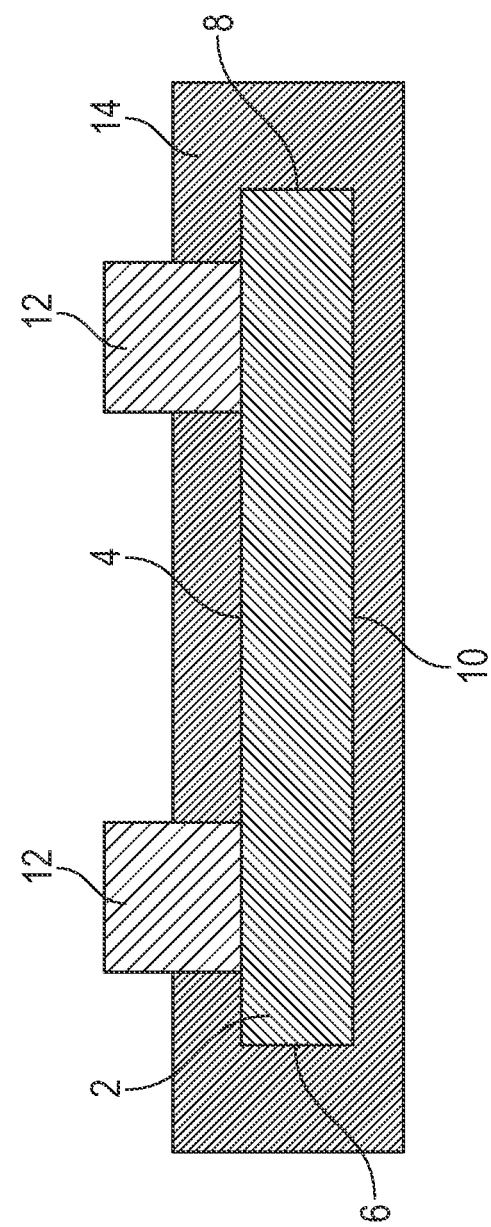

SILICON-ON-INSULATOR DIE SUPPORT STRUCTURES AND RELATED METHODS

CROSS REFERENCE TO RELATED APPLICATIONS

This application is a divisional application of the earlier filed U.S. Utility patent application Eiji Kurose entitled "Silicon-on-Insulator Die Support Structures and Related Methods," application Ser. No. 16/861,810 (the '810 application), now pending, which application is a continuation-in-part application of the earlier U.S. Utility patent application to Eiji Kurose entitled "Multi-Faced Molded Semiconductor Package and Related Methods," application Ser. No. 16/702,958, filed Dec. 4, 2019, now issued as U.S. Pat. No. 11,328,930; which application is a divisional application of the earlier U.S. Utility patent application to Eiji Kurose entitled "Multi-Faced Molded Semiconductor Package and Related Methods," application Ser. No. 15/679,661, filed Aug. 17, 2017, now U.S. Pat. No. 10,529,576, issued Jan. 7, 2020, the disclosures of each which are hereby incorporated entirely herein by reference.

The '810 application is also a continuation-in-part application of the earlier U.S. Utility Patent application to Krishnan et al. entitled "Thin Semiconductor Package and Related Methods," application Ser. No. 16/395,822, filed Apr. 26, 2019, now issued as U.S. Pat. No. 10,763,173; which application is a continuation of the earlier U.S. Utility patent application to Krishnan et al. entitled "Thin Semiconductor Package and Related Methods," application Ser. No. 15/679,664, filed Aug. 17, 2017, now U.S. Pat. No. 10,319,639, issued Jun. 11, 2019, the disclosures of each of which are hereby incorporated entirely herein by reference.

The '810 application is also a continuation-in-part application of the earlier U.S. Utility Patent application to Seddon et al. entitled "SOI Substrate and Related Methods," application Ser. No. 15/961,642, filed Apr. 24, 2018, now issued as U.S. Pat. No. 10,741,487, the disclosure of which is hereby incorporated entirely herein by reference.

BACKGROUND

1. Technical Field

Aspects of this document relate generally to semiconductor packages, such as wafer scale or chip scale packages. More specific implementations involve packages including a silicon-in-insulator (SOI) die.

2. Background

Semiconductor packages work to facilitate electrical and physical connections to an electrical die or electrical component in the package. A protective cover or molding has generally covered portions of the semiconductor packages to protect the electrical die or electrical component from, among other things, the environment, electrostatic discharge, and electrical surges.

SUMMARY

Implementations of a silicon-in-insulator (SOI) semiconductor die may include a first largest planar surface, a second largest planar surface and a thickness between the first largest planar surface and the second largest planar surface; and one of a permanent die support structure, a temporary die support structure, or any combination thereof coupled to one of the first largest planar surface, the second largest planar surface, the thickness, or any combination thereof. The first largest planar surface, the second largest planar surface, and the thickness may be included through a silicon layer coupled to a insulative layer.

Implementations of SOI semiconductor die may include one, all, or any of the following:

The warpage of one of the first largest planar surface or the second largest planar surface may be less than 200 microns.

The thickness may be between 0.1 microns and 125 microns.

The perimeter of the SOI semiconductor die may be rectangular and a size of the SOI semiconductor die may be at least 6 mm by 6 mm.

The perimeter of the SOI semiconductor die may be rectangular and a size of the SOI semiconductor die may be 211 mm by 211 mm or smaller.

The permanent die support structure may include a mold compound.

The one of the permanent die support structure, the temporary die support structure, or any combination thereof may include a perimeter including a closed shape.

The die may include a second permanent die support structure, a second temporary die support structure, or any combination thereof coupled to one of the first largest planar surface, the second largest planar surface, the thickness, or any combination thereof.

The permanent die support structure, the temporary die support structure, or any combination thereof may include two or more layers.

Implementations of a method of making silicon-on-insulator (SOI) die may include forming a ring around a perimeter of a second side of a silicon substrate through backgrinding the second side of the substrate to a desired substrate thickness; depositing an insulative layer onto the second side of the silicon substrate after backgrinding; forming one of a permanent die support structure, a temporary die support structure, or any combination thereof on the second side of the substrate; removing the ring around the perimeter of the second side of the silicon substrate; and singulating the silicon substrate into a plurality of SOI die.

Implementations of methods of making SOI die may include one, all, or any of the following:

The method may include forming a plurality of semiconductor devices on the first side of the silicon substrate, the first side opposite the second side of the silicon substrate.

The method may include stress relief etching the second side of the silicon substrate.

The insulative layer may be deposited using one of co-evaporation and co-sputtering.

The method may include dissipating heat through a heat dissipation device during deposition of the insulative layer.

The method does not include implanting hydrogen.

Implementations of a method of making silicon-on-insulator (SOI) die may include thinning a second side of a silicon substrate to a desired thickness; depositing an insulative layer over a conductive layer; forming one of a permanent die support structure, a temporary die support structure, or any combination thereof on the insulative layer; and singulating the silicon substrate into a plurality of SOI die.

Implementations of methods of making SOI die may include one, all, or any of the following:

The method may include depositing a conductive layer onto the second side of the silicon substrate.

The method may include patterning the conductive layer.

The conductive layer may include titanium.

The insulative layer may be deposited using one of co-evaporation and co-sputtering.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a cross sectional side view of a semiconductor package;

FIG. 2 is a top view of a semiconductor package;

DESCRIPTION

Figure 3:
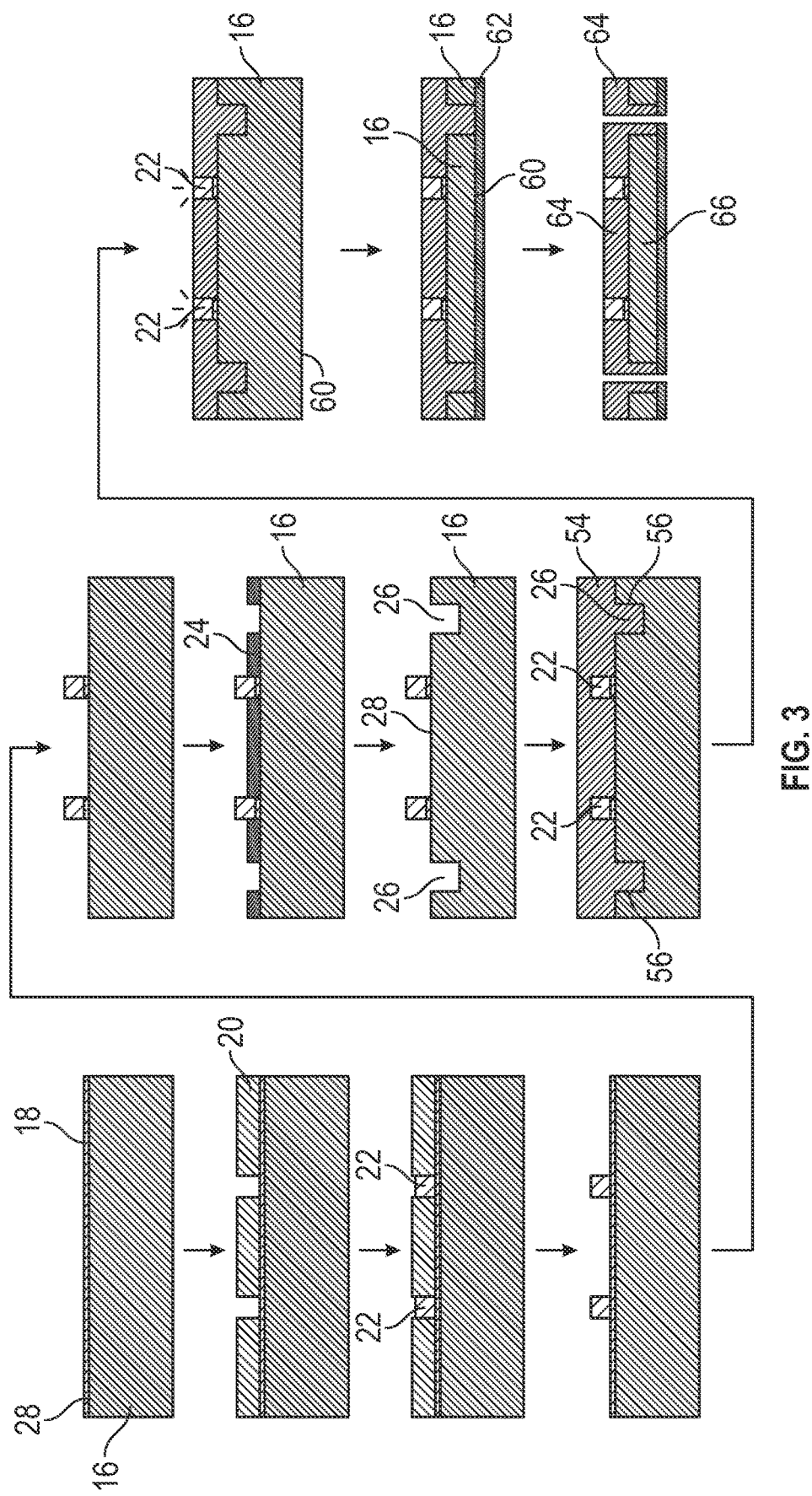
FIG. 3 is a first process flow illustrating the formation of a semiconductor package.

This disclosure, its aspects and implementations, are not limited to the specific components, assembly procedures or method elements disclosed herein. Many additional components, assembly procedures and/or method elements known in the art consistent with the intended silicon-in-insulator (SOI) die support structures and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such SOI die support structures, and implementing components and methods, consistent with the intended operation and methods.

Referring to FIG. 1, a cross sectional side view of a semiconductor package is illustrated. The semiconductor package includes a die 2 which includes a first side 4, a second side 6, a third side 8 opposite the second side 6, a fourth side, a fifth side opposite the fourth side (both fourth and fifth sides are located into and out of the drawing surface in this view), and a sixth side 10 opposite the first side 4. In various implementations, the second side 6 of the die 2, the third side 8 of the die, the fourth side of the die, and/or the fifth side of the die may include a notch therein.

In various implementations, one or more electrical contacts 12 are coupled to the first side 4 of the die 2. In various implementations, the electrical contacts are metal and may be, by non-limiting example, copper, silver, gold, nickel, titanium, aluminum, any combination or alloy thereof, or another metal. In still other implementations, the electrical contacts 12 may not be metallic but may rather be another electrically conductive material.

In various implementations, a first mold compound 14 covers the first, second, third, fourth, and fifth sides of the die. In various implementations, the mold compound may be, by non-limiting example, an epoxy mold compound, an acrylic molding compound, or another type of material capable of physically supporting the die and providing protection against ingress of contaminants. In various implementations, a laminate resin or second mold compound covers the sixth side 10 of the die.

The electrical contacts 12 each extend through a corresponding plurality of openings in the first mold compound 14. In various implementations, the electrical contacts 12 extend beyond the surface of the molding 14, as illustrated in FIG. 1, while in other implementations the electrical contacts are level or flush with the surface of the molding compound 14.

In various implementations, the sides of the die will have no chips or cracks, particularly on the semiconductor device side of the die. This is accomplished through forming the second, third, fourth, and fifth sides of each die using etching techniques rather than a conventional sawing technique. Such a method is more fully disclosed is association with the discussion of FIG. 3 herein.

Further, the first mold compound may be anchored to the second, third, fourth, and fifth sides of the die. In various implementations, the anchor effect is the result of interaction of the mold compound with a plurality of ridges formed along the second, third, fourth, and fifth sides of the die. This anchoring effect is more fully disclose in association with the discussion of FIG. 3 herein.

Referring to FIG. 2, a top view of a semiconductor package is illustrated. The molding compound 14 is clearly seen in FIG. 2 encompassing a perimeter of each electrical contact 12 (the shaded areas in FIG. 2) so that the entire first side of the die (along with every other side) is not exposed.

Referring to FIG. 3, a first process flow illustrating the formation of a semiconductor package is illustrated. In various implementations, the method for making a semiconductor package includes providing a wafer 16 which may include any particular type of substrate material, including, by non-limiting example, silicon, sapphire, ruby, gallium arsenide, glass, or any other semiconductor wafer substrate type. In various implementations, a metal layer 18 is formed on a first side 28 of the wafer 16 and may be formed using a sputtering technique. In other implementations, the metal layer 18 is formed using other techniques, such as, by non-limiting example, electroplating, electroless plating, chemical vapor deposition, and other methods of depositing a metal layer. In a particular implementation, the metal layer is a titanium/copper seed layer, while in other implementations, the metal layer may include, by non-limiting example, copper, titanium, gold, nickel, aluminum, silver, or any combination or alloy thereof.

In various implementations, a first photoresist layer 20 is formed and patterned over the metal layer 18. One or more electrical contacts 22 may be formed on the metal layer 18 and within the photoresist layer 20. In various implementations this may be done using various electroplating or electroless plating techniques, though deposition and etching techniques could be employed in various implementations. The electrical contacts 22 may be any type of electrical contact previously disclosed herein (bumps, studs, and so forth). In various implementations, the first photoresist layer 20 is removed through an ashing or solvent dissolution process and the metal layer 18 may be etched away after the electrical contacts are formed.

Figure 9:
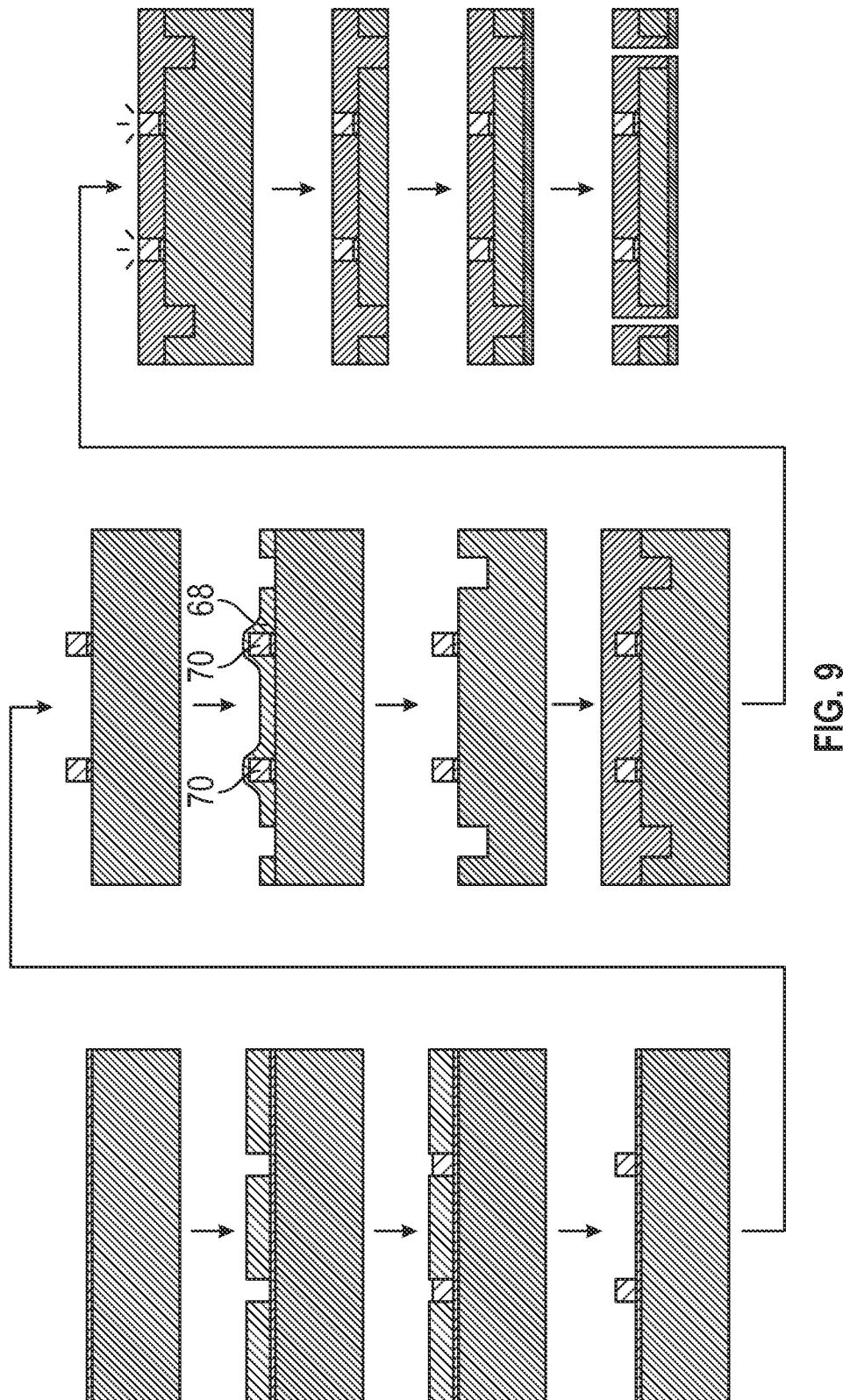
FIG. 9 is a second process flow illustrating the formation of a semiconductor package.

In various implementations, a second photoresist layer 24 is formed and patterned over the wafer 16. In various implementations, as illustrated in FIG. 3, the second patterned photoresist layer 24 does not cover the electrical contacts 22. In other implementations, the second photoresist layer is formed conformally over the electrical contacts along with the wafer. Referring to FIG. 9, a second process flow illustrating the formation of a semiconductor package is illustrated. In this process flow, a second photoresist layer 68 is formed as a conformal layer over the electrical contacts 70. Aside from this difference, the process depicted in FIG. 9 includes the same process steps as the process depicted in FIG. 3.

Referring back to FIG. 3, in various implementations, the method includes etching a plurality of notches 26 into the first side 28 of the wafer 16 using the second patterned photoresist layer. In various implementations, the width of the notches may be between about 50 and about 150 microns wide while in other implementations, the width of the notches may be less than about 50 microns or more than about 150 microns. In various implementations, the depth of the plurality of notches 26 may extend between about 25 and 200 microns into the wafer while in other implementations, the depth of the plurality of notches 26 may be less than about 25 microns or more than about 200 microns.

In various implementations, the plurality of notches may be formed using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the plurality of notches 26 in the first side 28 of the wafer 16.

Figure 4:
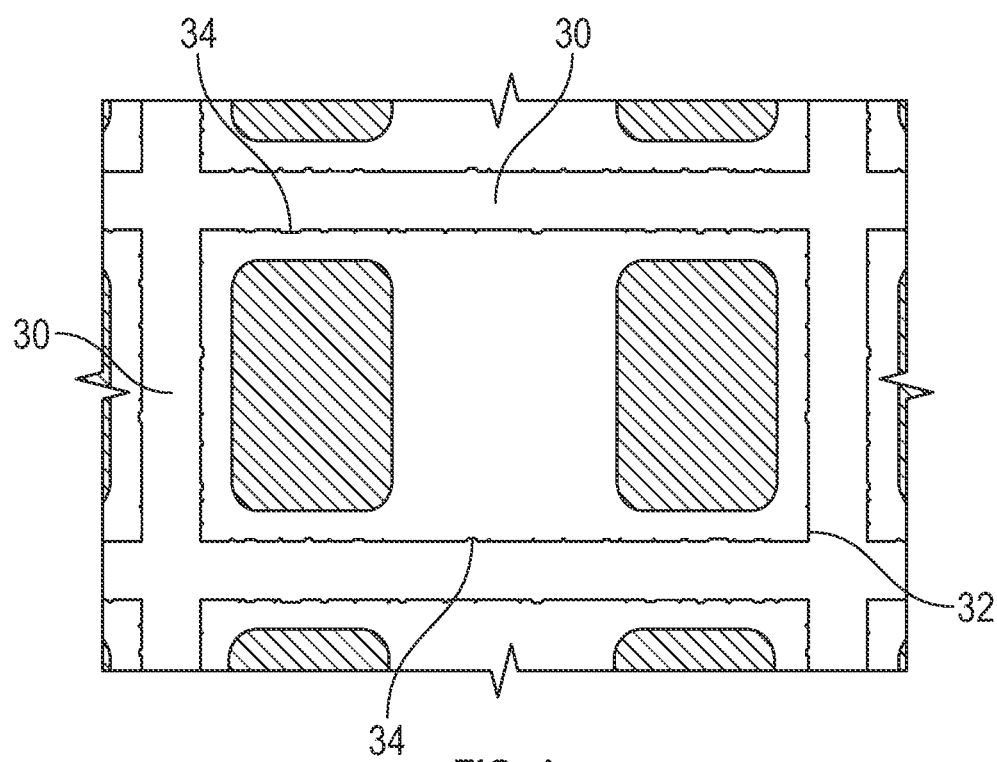
FIG. 4 is a top view of a semiconductor wafer with a plurality of notches cut therein.

Referring now to FIG. 4, a top view of a conventional semiconductor wafer with a plurality of saw cuts surrounding the plurality of die is illustrated. Using a saw to cut notches in a semiconductor wafer invariably results in the production of chips and cracks on the device side of the die and in the sidewalls 34 of the notches 30. The presence of the cracks and chips has the potential to compromise the reliability of the semiconductor package if the cracks and chips propagate into the device portion of the semiconductor die. Since the saw process involves the rubbing of the rotating blade against the die surface, the chipping and cracking can only be managed through saw processing variables (wafer feed speed, blade kerf width, cut depth, multiple saw cuts, blade materials, etc.) but not eliminated. Furthermore, because the saw process relies on passing the wafer underneath the blades, only square and rectangular sized die are typically produced using conventional saw techniques.

Figure 5:
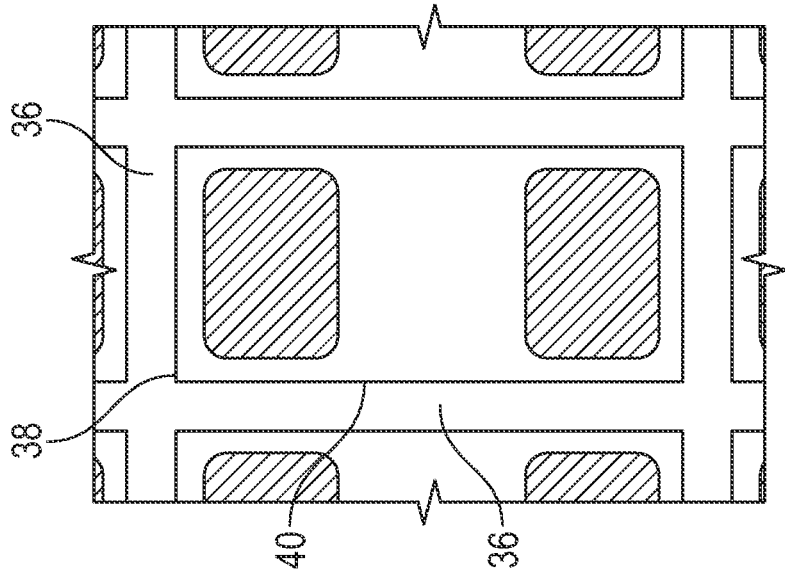
FIG. 5 is a top view of a semiconductor wafer with a plurality of notches etched therein.

Referring to FIG. 5, a top view of a semiconductor wafer with a plurality of notches etched therein is illustrated. In contrast to the appearance of the die processed using the conventional sawing method illustrated in FIG. 4, the plurality of notches 36 in the wafer 38 formed using etching techniques have edges and sidewalls 40 that do not exhibit cracks or chips therein. Because of the absence of the cracks and chips, the use of etching techniques to form a plurality of notches in a semiconductor wafer is likely to improve the reliability of the resulting semiconductor packages.

Figure 6:
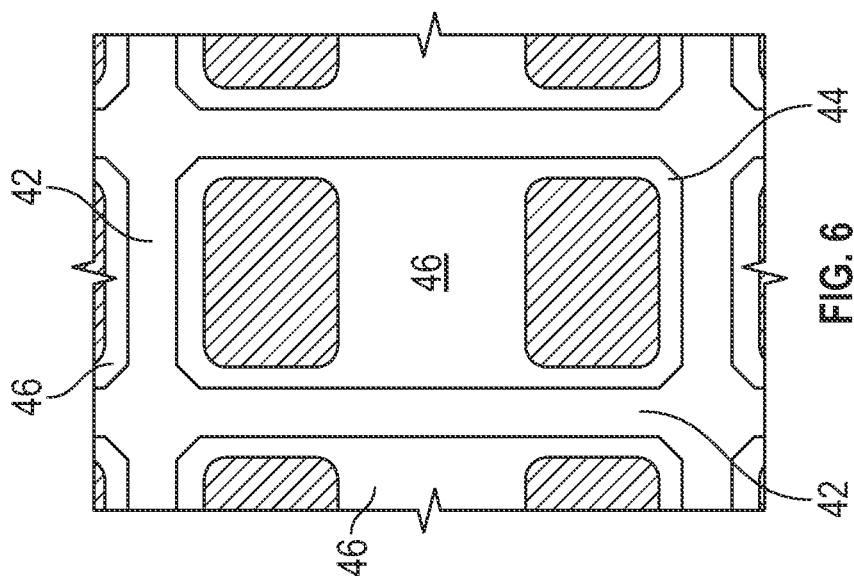
FIG. 6 is a top view of a second implementation of a semiconductor wafer with a plurality of notches etched therein.
Figure 7:
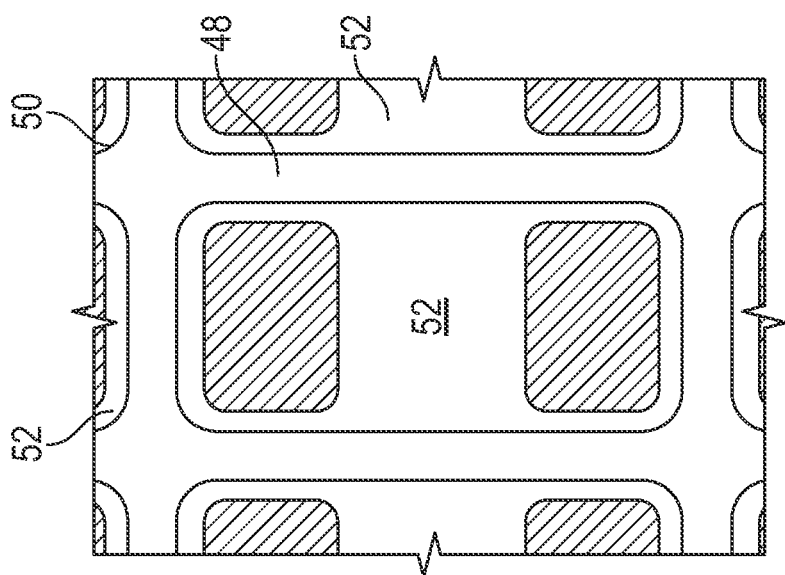
FIG. 7 is a top view of a third implementations of a semiconductor wafer with a plurality of notches etched therein.

Furthermore, using etching techniques to form a plurality of notches in a wafer allows for different shapes of perimeters of die to be produced. In various implementations, the second photoresist layer described in relation to FIG. 3 may be patterned in a way to form a plurality of notches that do not form die with rectangular perimeters. For example, referring to FIG. 6, a top view of a second implementation of a semiconductor wafer with a plurality of notches etched therein is illustrated. In various implementations, a plurality of notches 42 may be formed in a wafer 44. The plurality of notches 42 may form eventual die 46 with perimeters that are octagons. Referring to FIG. 7, a top view of a third implementations of a semiconductor wafer with a plurality of notches etched therein is illustrated. In various implementations, a plurality of notches 48 may be formed in a wafer 50. The plurality of notches 48 may form eventual die 52 with perimeters that are rounded rectangles. In other implementations, a plurality of notches may be formed in a wafer that form eventual die with perimeters that are any other closed geometrical shape.

Referring back to FIG. 3, in various implementations, the plurality of notches 26 formed have two substantially parallel sidewalls that extend substantially straight into the first side 28 of the wafer 16. In other implementations, two or more stepwise notches are formed in the first side 28 of the wafer 16. Each stepwise notch may be formed by creating a first notch in the wafer, and then forming a second more narrow notch within each first notch.

Referring to FIG. 3, an implementation of a method for forming a semiconductor package includes applying a first mold compound 54 into the plurality of notches 26 and over the first side of the wafer. In various implementations, as illustrated by FIG. 3, the first mold compound 54 may cover the electrical contacts 22. In other implementations, the first mold compound 54 may not completely cover the electrical contacts 22. The first mold compound may be applied using, by non-limiting example, a liquid dispensing technique, a transfer molding technique, a printer molding technique, or a compression molding technique. The molding compound may be an epoxy molding compound, an acrylic molding compound, or another type of molding compound disclosed herein.

Figure 8:
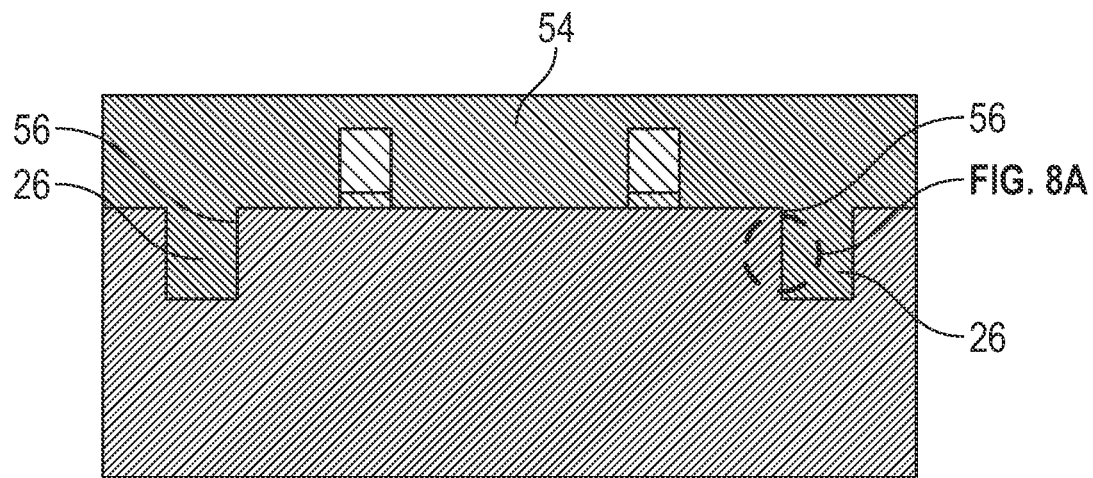
FIG. 8 is a cross sectional view of a portion of a wafer with molding applied thereto.
Figure 8A:
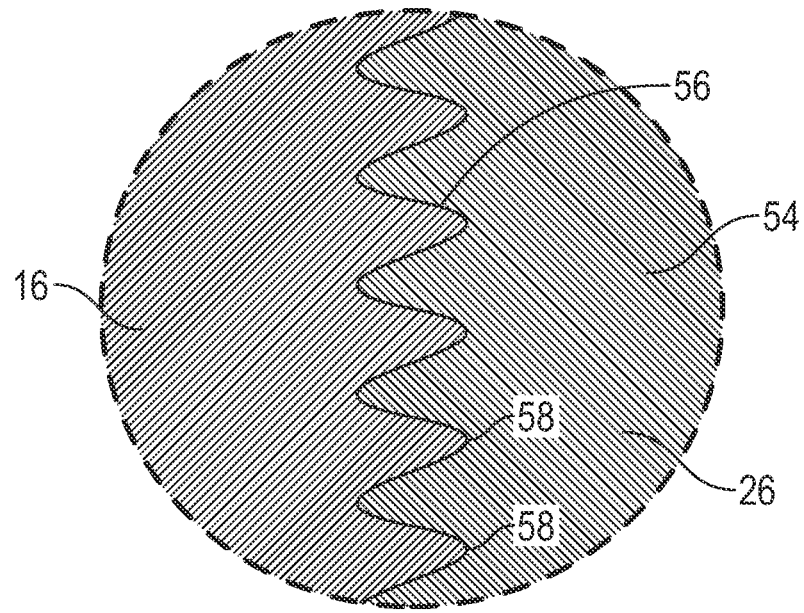
FIG. 8A is a magnified cross sectional view of the bond between a mold and a sidewall of a notch formed in the die.

In various implementations, the first mold compound 54 may be anchored to a plurality of sidewalls 56 of a plurality of notches 26. Referring now to FIG. 8, a cross sectional view of a portion of a wafer with molding applied thereto is illustrated. Referring now to FIG. 8A, a magnified cross sectional view of the bond between a mold and a sidewall of a notch formed in the die is illustrated. In various implementations, a plurality of ridges 58 may be formed in a sidewall 56 of each notch within the plurality of notches. In a particular implementation, the height of each ridge extending from the sidewall is substantially 0.2 microns tall with a pitch of substantially one micron. Thus, in implementations where the notch is 150 microns deep, there may be substantially 150 microns on each sidewall of the notch. In other implementations, the notches may be taller or shorter than 0.2 microns and may have a pitch more or less than one micron. The ridges may anchor the first mold compound 54 to the sidewalls 56 of the plurality of notches. In various implementations where the plurality of notches are etched using the Bosch process, the etching process may form ridges in the plurality of notches while etching the plurality of notches via the deposition/etching cycles of the deep reactive ion etch, thus increasing the adhesion between the first mold compound and the sidewall of each notch.

Referring back to FIG. 3, in various implementations where the first mold compound 54 covers the electrical contacts 22, the electrical contacts 22 may be exposed by grinding the first mold compound. In various implementations, a second side 60 of the wafer 16 may be ground to the plurality of notches 26 formed in the first side 28 of the wafer 16. In this way the various die of the semiconductor wafer are singulated from each other. In various implementations, the second side 60 of the wafer 16 may be ground using, by non-limiting example, a mechanical polishing technique, a chemical etching technique, a combination of a mechanical polishing and chemical etching technique, or any other grinding technique.

In various implementations, a second mold compound 62 or a laminate resin may be applied to the second side 60 of the wafer 16. In implementations where a second mold compound is applied, the mold compound may be any type of mold compound disclosed herein and may be applied using any technique disclosed herein.

In various implementations, as illustrated in the process flow depicted in FIG. 3, the first mold compound 54 is ground to expose the electrical contacts 22 before the second side 60 of the wafer 16 is ground and the second mold compound is applied. In other implementations, the first mold compound 54 may be ground to expose the electrical contacts 22 after the second side 60 of the wafer 16 is ground and the second mold compound is applied.

The method for making a semiconductor package includes singulating the wafer 16 into a plurality of semiconductor packages 64. The wafer 16 may be singulated by cutting or etching through the wafer where the plurality of notches 26 were originally formed. The wafer may be singulated by using, by non-limiting example, a saw, a laser, a waterjet, plasma etching, deep reactive-ion etching, or chemical etching. In various implementations, the Bosch process may be used to singulate the wafer 16. The method used to singulate the wafer may include singulating the wafer using thinner cuts or etches than were used to form the plurality of notches 26. In this manner, the first mold compound will cover the sides of each singulated die 66 within each semiconductor package 64. Specifically, in particular implementations the saw width used to singulate each semiconductor package may be between 20 and 40 microns thick. The semiconductor die within the semiconductor package may be covered by either a mold compound or a laminate resin on all six sides of the semiconductor die.

In various implementations, the first side of the die within each semiconductor package may include a perimeter that is, by non-limiting example, a rectangle, an octagon, a rectangle with rounded edges, or any other closed geometric shape.

Figure 10:
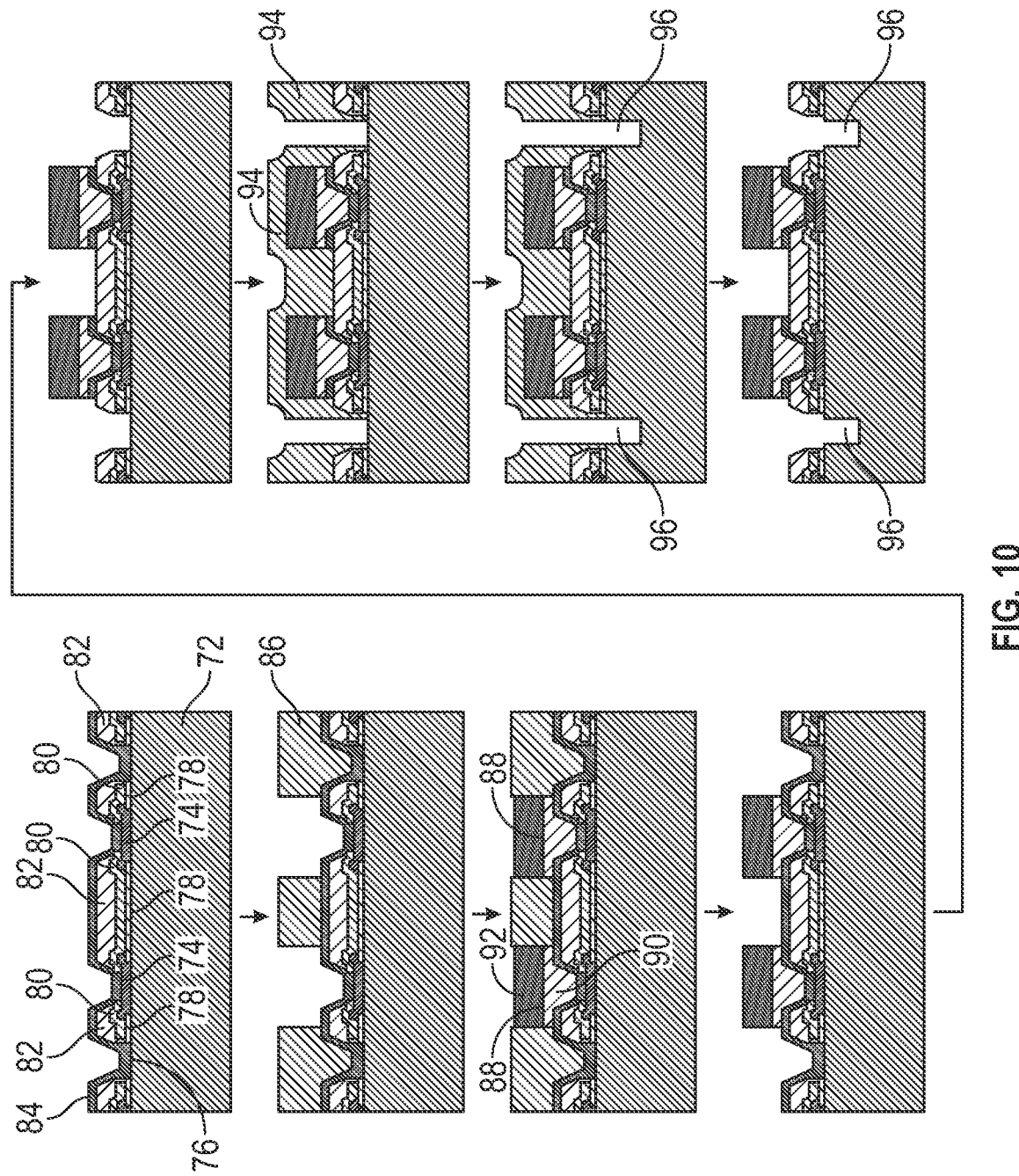
FIG. 10 is a third process flow illustrating a portion of the formation of a semiconductor package.

Referring now to FIG. 10, a third process flow illustrating a portion of the formation of a semiconductor package is illustrated. In various implementations the method for forming a semiconductor package includes providing a wafer 72, which may be any type of wafer substrate disclosed herein. In various implementations, one or more metal pads 74 may be coupled to a first side 76 of the wafer 72. The metal pad may include, by non-limiting example, aluminum, copper, nickel silver, gold, titanium, or any combination or alloy thereof.

In various implementations, a first passivation layer 78 may be coupled to a portion of the first side 76 of the wafer 72. The first passivation layer 78 may be a silicon dioxide passivation layer in various implementations, though it could be any of a wide variety of other types of layers, including, by non-limiting example, silicon nitride, polyimide, or another polymer or deposited material. In various implementations, a second passivation layer 80 may be coupled to a portion of the first side 76 of the wafer 72. The second passivation layer 80 may be a silicon nitride passivation layer. The second passivation layer may include the same material or a different material from the first passivation layer.

In various implementations, a third layer 82 may be coupled to a portion of the first side 76 of the wafer 72. The third layer may be either a polyimide, a polybenzoxazole, a phenol resin, or a combination of a polyimide, a polybenzoxazole, and a phenol resin. In various implementations, a metal seed layer 84 may be formed over the third layer and over the first side 76 of the wafer 72. The metal seed layer 84 may be any type of metal layer disclosed herein. In various implementations, the metal seed layer 84 may directly contact portions of the first side 76 of the wafer 72. In various implementations, the method includes forming and patterning a first photoresist layer 86 over the metal seed layer 84.

In various implementations, the method includes forming electrical contacts 88 coupled to the metal seed layer 84 and within the first photoresist layer 86. The electrical contacts 88 may be any type of electrical contact disclosed herein. In various implementations, the electrical contacts 88 may include a first layer 90 and a second layer 92. In various implementations, the first layer 90 may include copper and the second layer 92 may include tin, silver, or a combination of tin and silver. In various implementations, the method of forming a semiconductor package includes removing the first photoresist layer 86 and etching the portions of the metal seed layer 84 away that are not covered by the electrical contacts, after the electrical contacts are formed.

In various implementations, the method of forming a semiconductor package includes forming and patterning a second photoresist layer 94 over the first side 76 of the wafer 72. In various implementations, the second photoresist layer covers the electrical contacts 88, while in other implementations, the second photoresist layer 94 does not cover the electrical contacts 88. The second photoresist layer 94 may be used to etch a plurality of notches 96 into the wafer 72. The method includes removing the second photoresist layer 94 after the plurality of notches are etched into the wafer.

A first mold compound may be applied into the plurality of notches and over the first side 76 of the wafer 72 in the same manner the first mold compound in FIG. 3 is applied. The remainder of the method for forming a semiconductor package as depicted in FIG. 10 may include exposing the electrical contacts through grinding, grinding the backside of the wafer to the plurality of notches, applying a second mold compound or laminate resin to a backside of the wafer, and singulating the wafer into a plurality of semiconductor packages. These portions of forming a semiconductor package may be the same as or similar to respective portions for forming a semiconductor package illustrated by FIG. 3 and previously disclosed herein.

In various implementations, the semiconductor package produced by the method depicted in FIG. 10 may include one or more metal pads, one or more passivation layers, a polyimide, a phenol resin, a polybenzoxazole, and any combination thereof, between the semiconductor die and the first mold compound.

Figure 11:
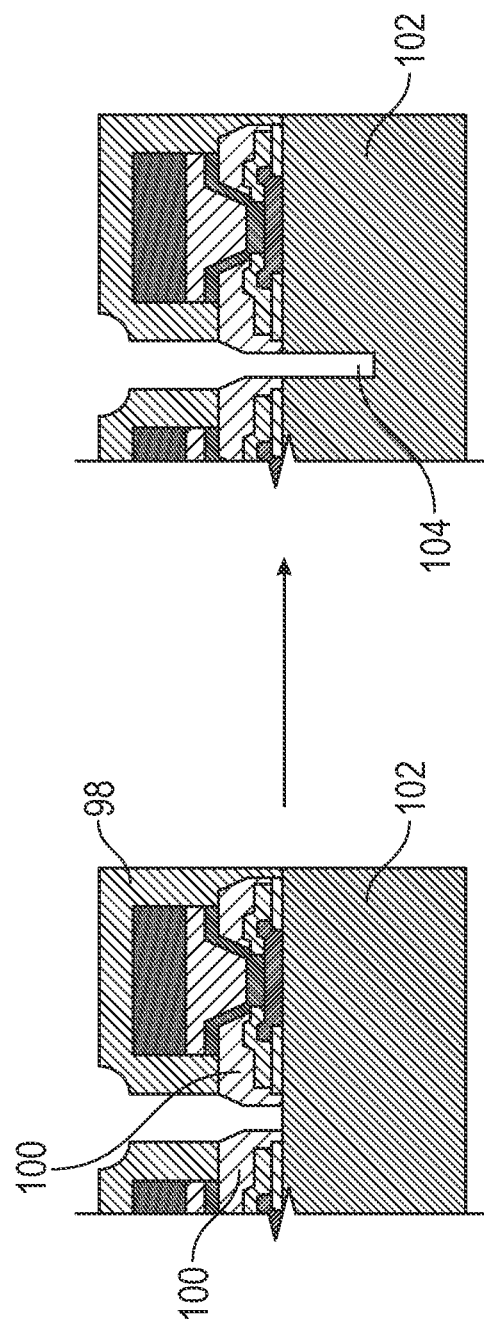
FIG. 11 illustrates a first alternative for forming the notches in the third process flow.

Referring to FIGS. 11-14, alternative methods for forming a plurality of notches in the process illustrated by FIG. 10 is illustrated. Referring to FIG. 11, a method of forming a plurality of notches using a patterned photoresist layer and one of a polyimide, polybenzoxazole, and a phenol resin in combination with an etching process is illustrated. In various implementations, a patterned photoresist layer 98 may be over a mask 100 including either a patterned polyimide layer, a patterned polybenzoxazole layer, or a patterned phenol resin layer. The mask 100 may be over a wafer 102. A notch 104 may be formed in the wafer 102 using the patterned photoresist layer and the mask using any etching process disclosed herein.

Figure 12:
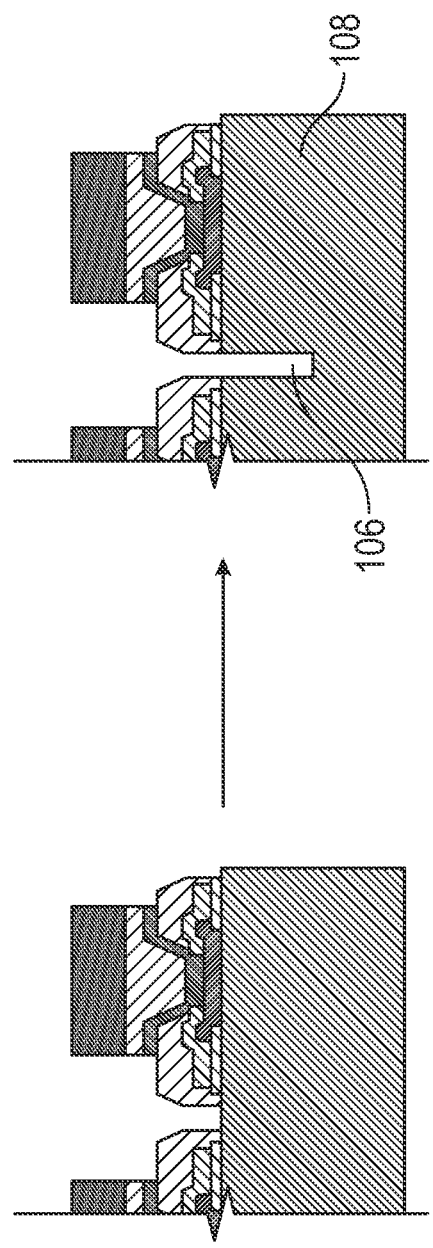
FIG. 12 illustrates a second alternative for forming the notches in the third process flow.

Referring to FIG. 12, a method of forming a plurality of notches using one of a polyimide, polybenzoxazole, and a phenol resin in combination with any etching process disclosed herein is illustrated. The method may be the same as the method depicted by FIG. 11, with the difference being that the method depicted by FIG. 12 does not include a patterned photoresist layer used to form a notch 106 into a wafer 108.

Figure 13:
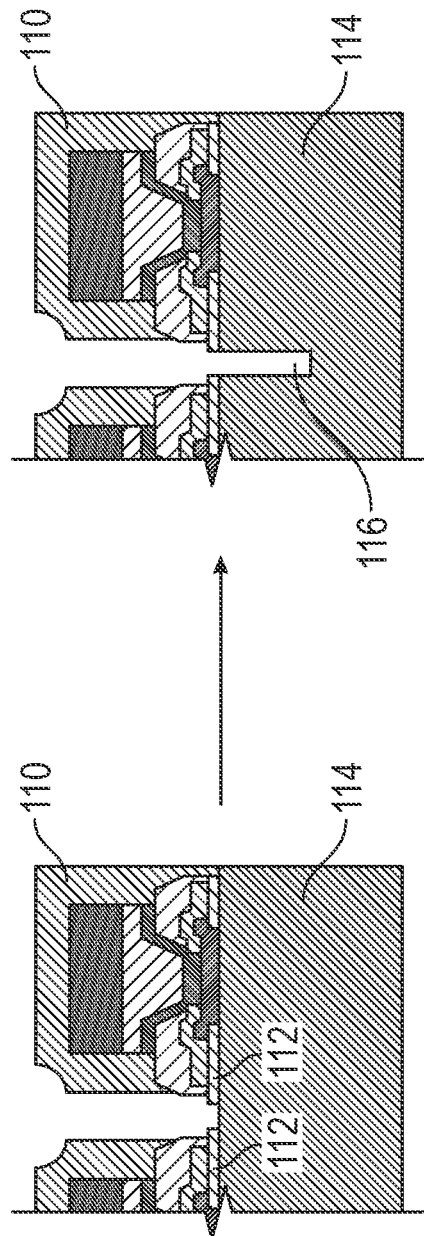
FIG. 13 illustrates a third alternative for forming the notches in the third process flow.

Referring to FIG. 13, a method of forming a plurality of notches using a patterned photoresist layer and passivation mask is illustrated. In various implementations, a patterned photoresist layer 110 may be over a passivation mask 112. The passivation mask 112 may include any passivation layer disclosed herein. The passivation mask 112 may be over a wafer 114. A notch 116 may be formed in the wafer 114 using the patterned photoresist layer 110 and the passivation mask 112 and any etching process disclosed herein.

Figure 14:
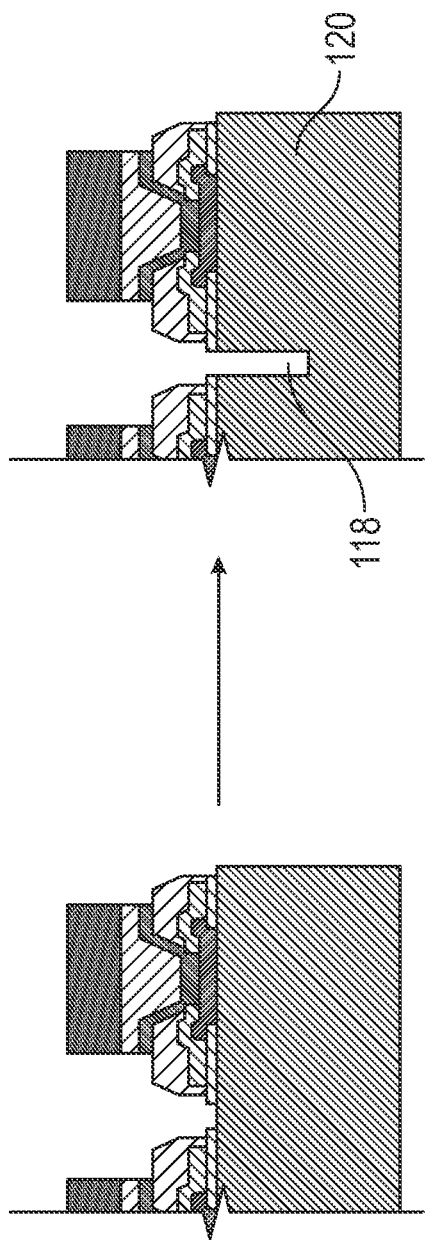
FIG. 14 illustrates a fourth alternative for forming the notches in the third process flow.

Referring to FIG. 14, a method of forming a plurality of notches using a passivation mask in combination with any of the etching method disclosed herein is illustrated. The method may be the same as the method depicted by FIG. 13, with the difference being that the method depicted by FIG. 14 does not include a patterned photoresist layer used to form a notch 116 into a wafer 118.

Figure 15:
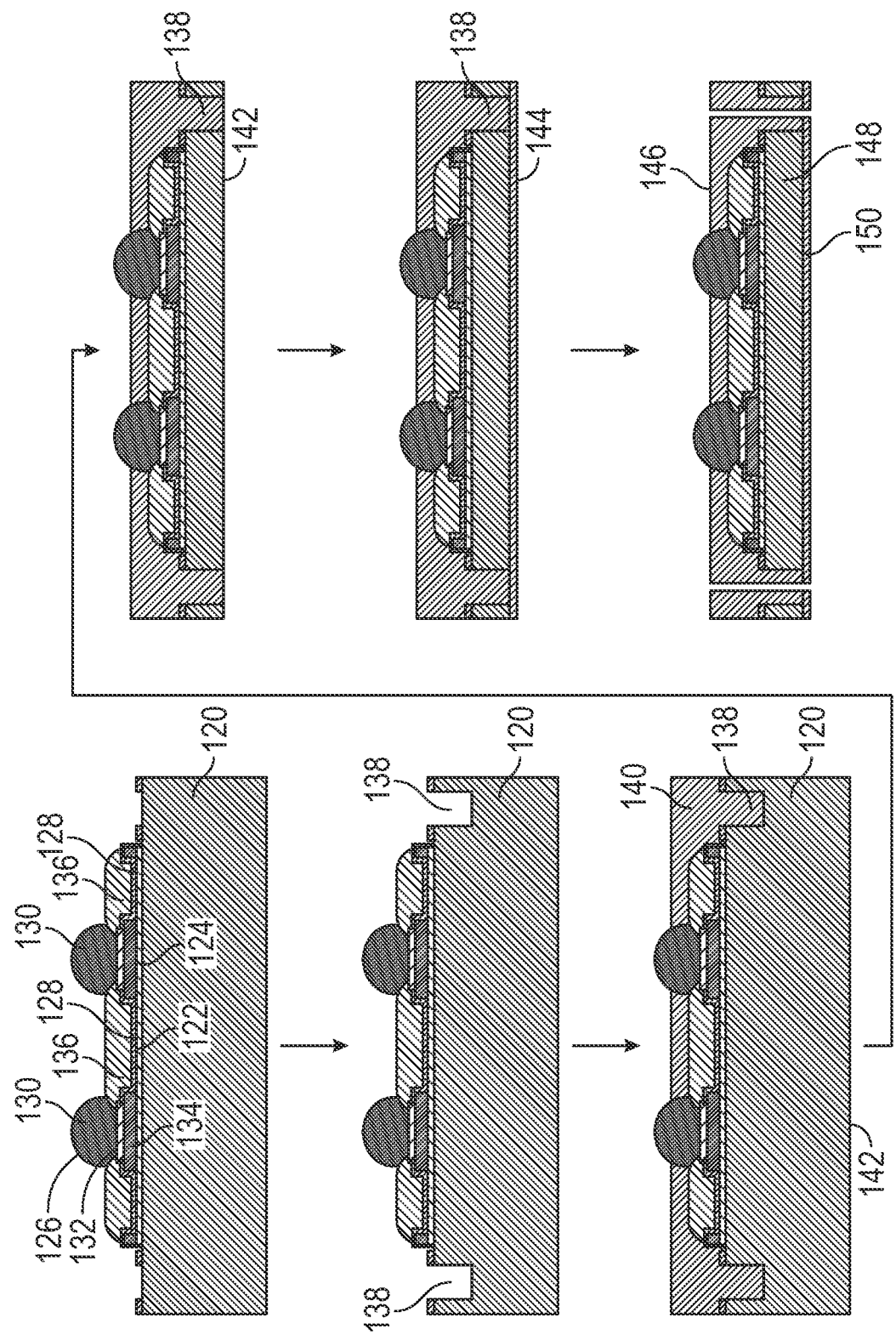
FIG. 15 is a fourth process flow illustrating the formation of a semiconductor package.

Referring to FIG. 15, a fourth process flow illustrating the formation of a semiconductor package is illustrated. The method for forming a semiconductor package illustrated in FIG. 15 includes providing a wafer 120. In various implementations, an interlayer 122 may be coupled to a first side 124 of the wafer 120. In various implementations, a passivation layer 128 may be coupled to the wafer 120. The passivation layer may be any type of passivation layer disclosed herein.

In various implementations, one or more electrical contacts 126 may be coupled to the wafer 120. In various implementations, the electrical contacts include a bump 130. The electrical contacts may include a first metal layer 132 coupled to the bump 130. The first metal layer may include any metal disclosed herein. In a particular implementation, the first metal layer includes nickel and gold. The electrical contacts 128 may include a second metal layer 134 coupled to the first metal layer 132. The second metal layer 134 may include any metal disclosed herein. In a particular implementation, the second metal layer 134 includes aluminum. In various implementations, a solder resist layer 136 may be coupled over the wafer 120. In other implementations, no solder resist layer is included.

In various implementations, the passivation layer 128 may be patterned and may directly contact portions of the wafer 120. In such implementations, the patterned passivation layer, or mask, may be used to etch a plurality of notches 138 into the first side 124 of the wafer 120 using any etching process disclosed herein. The plurality of notches may be etched using any method disclosed herein, and may be any type of notch previously disclosed herein.

In various implementations, a first mold compound 140 is applied into the plurality of notches 138 and over the first wafer 120. The first mold compound 140 may be any mold compound disclosed herein and may be applied using any technique disclosed herein. In various implementations, the first mold compound 140 does not entirely cover the electrical contacts 126, as is illustrated by FIG. 15. In other implementations, the first mold compound does entirely cover the electrical contacts 126. In implementations where the first mold compound 140 does entirely cover the electrical contacts 126, the first mold compound may be ground to expose the electrical contacts 126.

In various implementations, a second side 142 opposite the first side 124 of the wafer 120 may be ground using any grinding method disclosed herein to the plurality of notches. A second mold compound 144 or laminate resin may then be applied to the second side 142 of the wafer 120.

The wafer 120 may then be singulated into a plurality of semiconductor packages 146. The wafer may be singulated using any technique disclosed herein. The semiconductor die 148 with the semiconductor package 146 may have all six sides covered by a mold compound. In other implementations, the sixth side of the die 150 may be covered by a laminate resin.

In various implementations, the semiconductor package formed by the method illustrated in FIG. 15 may include either a solder resist layer, a passivation layer, an interlayer, or a combination of a solder resist layer, a passivation layer, and an interlayer coupled to the first side of the wafer and covered by the first mold compound.

Figure 16:
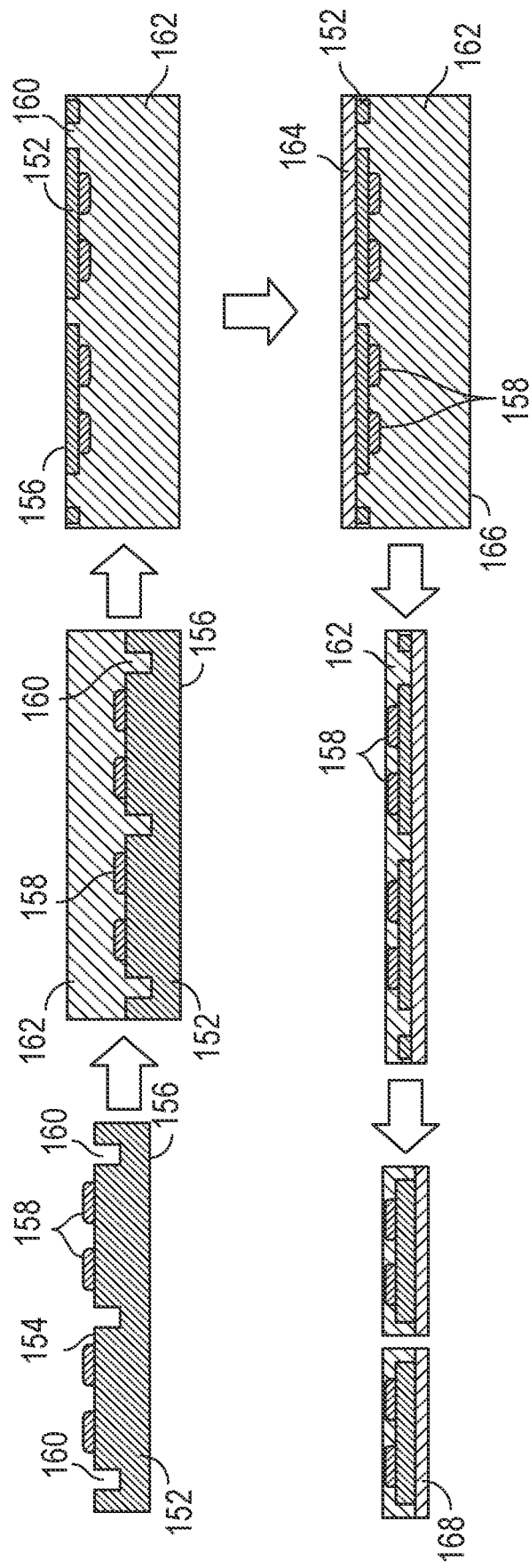
FIG. 16 is an illustration of a process flow for forming an ultra-thin semiconductor package.

Referring to FIG. 16, a process flow for forming an ultra-thin semiconductor package is illustrated. As used herein, an "ultra-thin" semiconductor package is designed to handle a device die of about 25 microns in thickness or thinner. The process flow illustrates cross sectional side views of the wafer and die. In various implementations, a method for forming an ultra-thin semiconductor package includes providing a wafer 152 with a first side 1544 and a second side 156. The wafer 152 may include a substrate material which may be, by non-limiting example, silicon, gallium nitride, silicon carbide, or another wafer substrate material. The first side of the wafer 154 includes or is coupled to a plurality of electrical contacts 158. The electrical contacts 158 may be metallic or made of another material that is electrically conductive.

In various implementations, the method for forming the ultra-thin semiconductor package includes forming a plurality of notches 160 in the first side 154 of the wafer 152. While not shown in FIG. 16, it is understood that the plurality of notches intersect one another in a substantially perpendicular direction across the first side 154 of the wafer 152. In various implementations, the notches formed may extend about 25 or more microns deep into the wafer. In other implementations, the notches 160 only extend between about 10 and about 25 microns deep in the wafer 152. In still other implementations, the notches 160 extend less than about 10 microns deep in the wafer 152. The plurality of notches may be formed using, by non-limiting example, a saw, a laser, a waterjet, plasma etching, or chemical etching. In various implementations, a chemical etching process marketed under the tradename BOSCH® (the "Bosch process") by Robert Bosch GmbH, Stuttgart Germany, may be used to form the notches 160 in the first side 154 of the wafer 152.

In various implementations, the notches 160 formed have two substantially parallel sidewalls that extend substantially straight into the first side 154 of the wafer 152. In other implementations, a plurality of stepwise notches are formed in the first side 154 of the wafer 152. Each stepwise notch may be formed by forming a first notch in the wafer having a first width, and then forming a second notch with a second width within each first notch where the first width is wider than the second width.

The method for forming the ultra-thin semiconductor package includes coating the first side 154 of the wafer 152 and the interiors of the plurality of notches 160 with a molding compound 162. The molding compound may also cover the electrical contacts 158 in various method implementations. The molding compound 162 may be applied using, by non-limiting example, a liquid dispensing technique, a transfer molding technique, or a compression molding technique.

The molding compound may be an epoxy molding compound, an acrylic molding compound, or any other molding compound capable of hardening and providing physical support and/or humidity protection to a semiconductor device. In various implementations, the molding compound 162 may be cured under a temperature between about 100-200 degrees Celsius and while a pressure of substantially 5 psi is applied to the second side 156 of the wafer. In other implementations, the molding may be cured with different temperatures and different pressures. In implementations with an epoxy molding compound, after the molding compound 162 is applied, it may be heat treated to enhance the epoxy cross linking.

In various implementations, the method for forming an ultra-thin semiconductor package includes grinding the second side 156 of the wafer 152 to a desired thickness. In various implementations the second side 156 of the wafer 152 may be ground away to an extent that the plurality of notches 160 filled with molding compound 162 extends completely through the wafer. In various implementations, more than this may be ground away, thus decreasing the depth of the notches 160. In this way the semiconductor devices in the wafer are separated from each other, but still held together through the molding compound. Because the molding compounds now supports the semiconductor devices, the devices can be ground very thin. In various implementations, the second side 156 of the wafer 152 may be ground using, by non-limiting example, a mechanical polishing technique, a chemical etching technique, a combination of a mechanical polishing and chemical etching technique, or any other grinding technique. In various implementations, the wafer is ground to a thickness between about 10 and about 25 microns. In other implementations, the wafer is ground to a thickness less than about 10 microns. In still other implementations, the wafer may be ground to a thickness more than about 25 microns.

In various implementations, the method for forming an ultra-thin semiconductor package includes forming a back metal 164 on the second side 156 of the wafer 152. The back metal may include a single metal layer or multiple metal layers. In various implementations, the back metal may include, by non-limiting example, gold, titanium, nickel, silver, copper, or any combination and/or alloy thereof. Because the wafer 152 is thinned and the back metal 164 is applied to the thinned wafer while the entirety of the molding compound 162 is coupled to the front side 154 of the wafer 152 and the interior of the notches 160, it may be possible to reduce or eliminate warpage of the wafer. Further, wafer handling issues are reduced when thinning the wafer and applying the back metal 164 because the entirety of the molding compound 162 is still coupled to the wafer 152. Furthermore, curling and warpage of the extremely thin semiconductor die now coated with back metal are significantly reduced due to the support provided by the molding compound.

In various implementations, the method for forming an ultra-thin semiconductor package includes exposing the plurality of electrical contacts 158 covered by the molding compound 162 by grinding a first side 166 of the molding compound 162. The first side 166 of the molding compound 162 may be ground using, by non-limiting example, a mechanical polishing technique, a chemical etching technique, a combination of a mechanical polishing and chemical etching technique, or other grinding technique.

In various implementations, the method for forming an ultra-thin semiconductor package includes singulating the wafer 152 into single die. The wafer may be singulated by cutting or etching through the wafer where the plurality of notches 160 were originally formed. The wafer may be singulated by using, by non-limiting example, a saw, a laser, a waterjet, plasma etching, or chemical etching. In various implementations, the Bosch process previously mentioned may be used to singulate the wafer 152. The method used to the singulate the wafer may include singulating the wafer using thinner cuts or etches than were used to form the plurality of notches 160. In this manner, the molding compound 162 will cover the sides of each singulated die 168.

Figure 17:
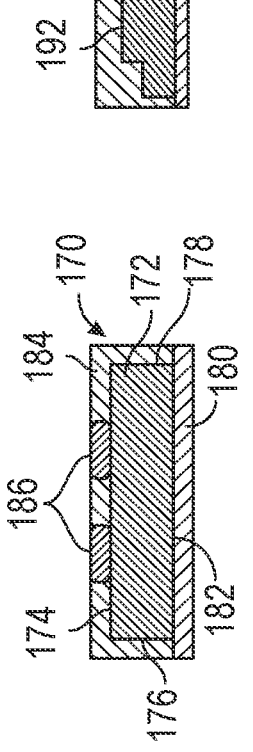
FIG. 17 is a cross sectional view of an ultra-thin semiconductor package formed by the process of FIG. 16.

Referring to FIG. 17, a cross sectional view of an ultra-thin semiconductor package formed by the process of FIG. 16 is illustrated. In various implementations, the ultra-thin semiconductor package 170 may be a power semiconductor package. Specifically, the ultra-thin semiconductor package may be a MOSFET. In other implementations, the ultra-thin semiconductor package 170 is not used for a power semiconductor device, but may be used for other semiconductor device types. In various implementations, the ultra-thin semiconductor package has a plurality of electrical contacts 186 coupled to the first side 174 of the die and exposed through a first molding compound 184. In various implementations, the die 172 of the semiconductor package 170 may be between about 10-25 microns thick. In other implementations, the die 172 is less than about 10 microns thick. In still other implementations, the die 172 may be more than about 25 microns thick. The ultra-thin nature of the power semiconductor package may improve the $R_{DS(ON)}$ of the package and/or semiconductor device/die.

In various implementations, the ultra-thin semiconductor package 170 is covered by the first molding compound 184 on a first side 174, a second side 176, a third side 178, a fourth side, and a fifth side of the die 172. A metal layer 180 may be coupled to a sixth side 182 of the die. In various implementations, more than one metal layer may be coupled to the sixth side 182 of the die. The metal may include, by non-limiting example, gold, titanium, nickel, silver, copper, or any combination or alloy thereof.

Figure 18:
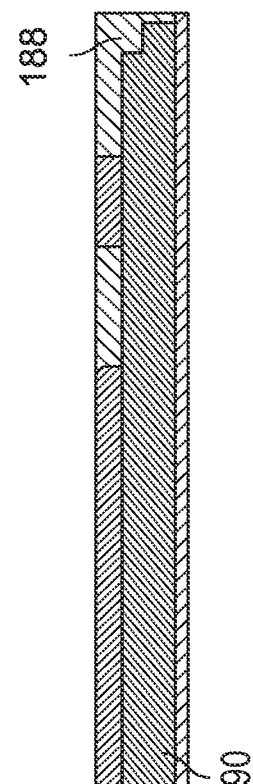
FIG. 18 is a cross sectional view of an ultra-thin semiconductor package with a notch formed therein.

Referring now to FIG. 18, a cross sectional view of an ultra-thin semiconductor package with a notch formed therein is illustrated. The package illustrated in FIG. 18 may be the same or similar to the package illustrated in FIG. 17, with the exception that the package illustrated in FIG. 18 includes a notch 188 around a perimeter of the first side 192 of the die 190. The notch 188 may result from forming a stepwise notch in a wafer as described above in relation to FIG. 16. In various implementations, the stepwise notch may not extend around the entire perimeter of the die, but may be formed just along two opposing edges of the first side 192 of the die 190.

Figure 19:
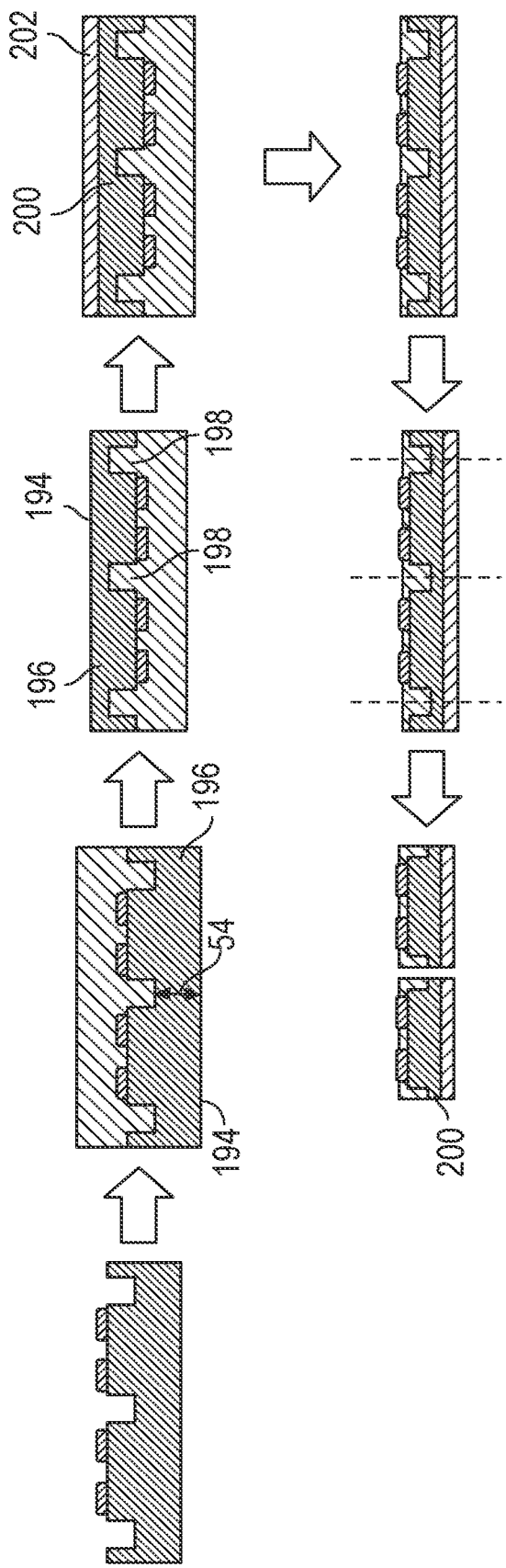
FIG. 19 is an illustration of a process flow for forming an ultra-thin semiconductor package with a portion of the die exposed.

Referring to FIG. 19, a process flow for another implementation of a method of forming an ultra-thin semiconductor package with a portion of the die exposed is illustrated. The method implementation illustrated in FIG. 19 is the same as the process illustrated by FIG. 16, with the exception that the second side 194 of the wafer 196 is not ground through to the plurality of notches 198. Because of this, a portion 200 of the wafer 196 exists between the plurality of notches 198 and the back metal 202. In various implementations, about 90-95% of the back portion 194 of the wafer 196, or the portion of the wafer that extends from the second side 194 of the wafer to the plurality of notches 198, is removed through grinding. In other implementations, more or less than this may be removed through grinding. The other process steps in the method implementation (molding, grinding, and singulation, etc.) are carried out similarly to the method implementation illustrated in FIG. 16 and described herein.

Figure 20:
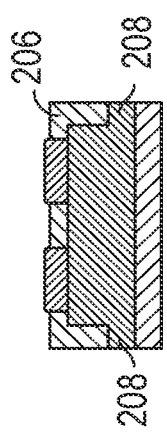
FIG. 20 is a cross sectional view of an ultra-thin semiconductor package formed by the process of FIG. 19.

Referring to FIG. 20, a cross sectional view of an ultra-thin semiconductor package formed by the process of FIG. 19 is illustrated. The semiconductor package of FIG. 20 may be the same as the semiconductor package of FIG. 17, with the exception that a portion of the die 208 is present between the molding compound and the back metal along the sides of the die. Thus, in the implementation illustrated by FIG. 20, a portion of the die 208 is exposed on the various opposing sides of the die.

Figure 21:
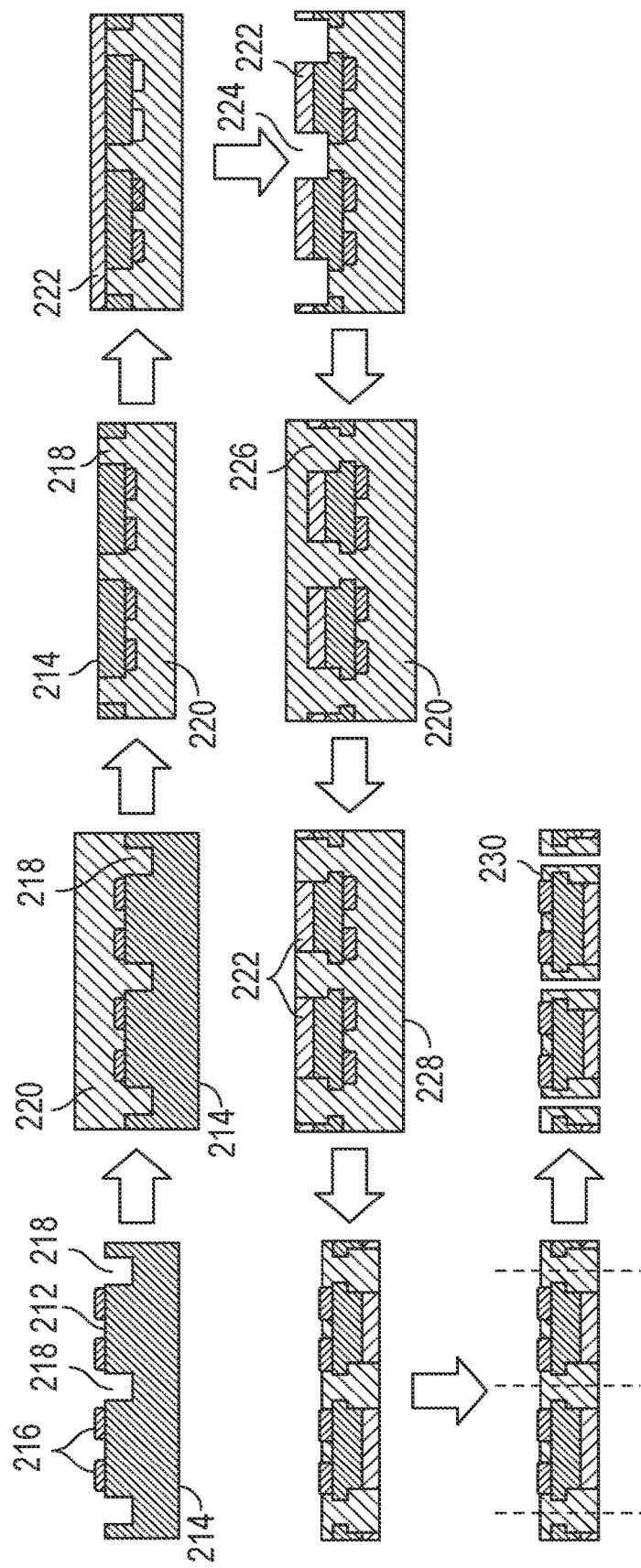
FIG. 21 is an illustration of a process flow for forming an ultra-thin semiconductor package with a notch formed therein.

Referring to FIG. 21, a process flow for another implementation of forming an ultra-thin semiconductor package with a notch formed therein is illustrated. The process flow illustrates cross sectional side views of the wafer and die. In various implementations, the method includes providing a wafer. The wafer has a first side 212 and a second side 214. The wafer may be, by non-limiting example, silicon, gallium nitride, silicon carbide, or other wafer material like those disclosed herein. The first side 212 of the wafer includes or is coupled to a plurality of electrical contacts 216. The electrical contacts 216 may be metallic or made of any other electrically conductive material disclosed herein.

In various implementations, the method includes forming a plurality of notches 218 in the first side 212 of the wafer. While not illustrated in FIG. 21, it is understood that the plurality of notches intersect one another in a substantially perpendicular direction. The notches 218 formed may be any depth previously disclosed herein, any shape previously disclosed herein (including stepwise), and formed using any method previously disclosed herein.

The method for forming the ultra-thin semiconductor package of FIG. 21 includes coating the first side 212 of the wafer and the interiors of the plurality of notches 218 with a molding compound 220. The molding compound may also cover the electrical contacts 216. The molding compound 220 may be applied using any method previously disclosed herein, and may be any type of molding compound previously disclosed herein. In various implementations, the molding compound may be cured or heat treated as described above in relation to FIG. 16.

In various implementations, the method for forming an ultra-thin semiconductor package includes grinding the second side 214 of the wafer to a desired thickness. The second side of the wafer may be ground using any grinding method disclosed herein, and may be ground to any thickness described herein. In various implementations the second side 214 of the wafer may be ground away to an extent that the plurality of notches 218 filled with molding compound 220 extend completely through the wafer. In various implementations, more of the wafer material (and, correspondingly some of the molding compound) may be ground away, thus decreasing the depth of the notches 218.

In various implementations, the method for forming an ultra-thin semiconductor package includes forming a back metal 222 on the second side 214 of the wafer. The back metal may include a single metal layer or multiple metal layers. In various implementations, the back metal may include, by non-limiting example, gold, titanium, nickel, silver, copper, or any combination thereof.

The method of forming the ultra-thin semiconductor package as illustrated in FIG. 21 includes forming at least one groove 224 through the back metal 222. In various implementations, the at least one groove is aligned with a notch from the plurality of notches 218. In various implementations, there is a groove formed for every notch. In various implementations, the groove is wider than the notch, while in other implementations, the groove is as wide as, or less wide than, the corresponding notch. As illustrated in FIG. 21, the groove 224 may extend into the second side 214 of the wafer. In other implementations, the groove 224 may only extend through the thickness of the back metal 222.

Because the wafer is thinned and the back metal 222 is applied to the thinned wafer while the entirety of the first molding compound 220 is coupled to the front side 212 of the wafer and the interior of the notches 218, it reduces warpage of the wafer. Further, wafer handling issues are reduced when thinning the wafer, applying the back metal 222, and forming the at least one groove 224 through the back metal because the entirety of the molding compound 220 is still coupled to the wafer as previously discussed.

The method implementation illustrated in FIG. 21 includes coating the second side 214 of the wafer and the back metal layer 222 with a second molding compound 226. In this manner, as illustrated by FIG. 21, the first molding compound and the second molding compound may completely encapsulate the electrical contacts 216, the wafer, and the back metal 222. The second molding compound may be any type disclosed herein and may be applied and cured using any method described herein. In various implementations, the second molding compound may be chemically the same as the first molding compound, but it may be chemically different in other implementations. The method implementation illustrated in FIG. 21 includes grinding the second molding compound to a desired thickness. In various implementations, the second molding compound is ground to expose the back metal 222. The second molding compound may be ground using any grinding method disclosed herein.

In various implementations, the method for forming an ultra-thin semiconductor package includes exposing the plurality of electrical contacts 216 covered by the molding compound 220 by grinding a first side 228 of the molding compound 220. The first side 228 of the molding compound 220 may be ground using any method disclosed herein.

In various implementations, the method for forming an ultra-thin semiconductor package also includes singulating the wafer, first molding compound 220, and second molding compound 226 into single die packages (or multi-die packages as desired). The wafer may be singulated by cutting or etching through the wafer where the plurality of notches 218 were originally formed. The wafer may be singulated by using, by non-limiting example, a saw, a laser, a waterjet, plasma etching, or chemical etching. In various implementations, the Bosch process may be used to singulate the wafer, first molding compound 220, and second molding compound 226 into individual packages. The method used to the singulate the wafer may include singulating the wafer using thinner cuts or etches than were used to form the plurality of notches 218. In this manner the first molding compound 220 and second molding compound 226 cover all the sides of each singulated die 230 leaving the electrical contacts exposed.

Figure 22:
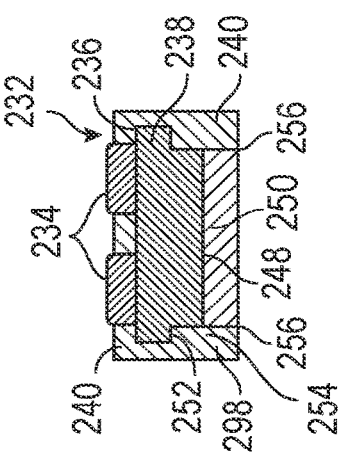
FIG. 22 is a cross sectional view of an ultra-thin semiconductor package formed by the process of FIG. 21.

Referring to FIG. 22, a cross sectional view of an ultra-thin semiconductor package formed by the process of FIG. 21 is illustrated. In various implementations, the ultra-thin semiconductor package 232 may include a power semiconductor device. Specifically, the ultra-thin semiconductor package may include a MOSFET. In other implementations, the ultra-thin semiconductor package 232 may not include a power semiconductor device.

In various implementations, the ultra-thin semiconductor package 232 has a plurality of electrical contacts 234 coupled to the first side 236 of the die and exposed through a first molding compound 90.

In various implementations, the die 238 of the semiconductor package 232 may be between about 10-25 microns thick. In other implementations, the die 238 is less than about 10 microns thick. In still other implementations, the die 238 may be more than about 25 microns thick. As previously discussed, the ultra-thin nature of the power semiconductor package may improve the $R_{DS(ON)}$ of the package.

In various implementations, the ultra-thin semiconductor package 232 is covered by the first molding compound 240 on a first side 236 and by the first molding compound 240 and the second molding compound 298 on a second side 244, a third side 246, a fourth side, and a fifth side of the die 238. In various implementations, the top 252 of the notch 254 may be considered part of the sixth side 248 of the die. In this sense, the die may be covered by the second molding compound 298 on the sixth side of the die. A metal layer 250 may be coupled to the sixth side 248 of the die. In various implementations, more than one metal layer may be coupled to the sixth side 248 of the die. The metal may include, by non-limiting example, gold, titanium, nickel, silver, copper, or any combination or alloy thereof. In various implementations, the notch 254 may extend around a perimeter of the die. In various implementations, a molding compound may cover the sides 256 of the metal layer 250.

Figure 23:
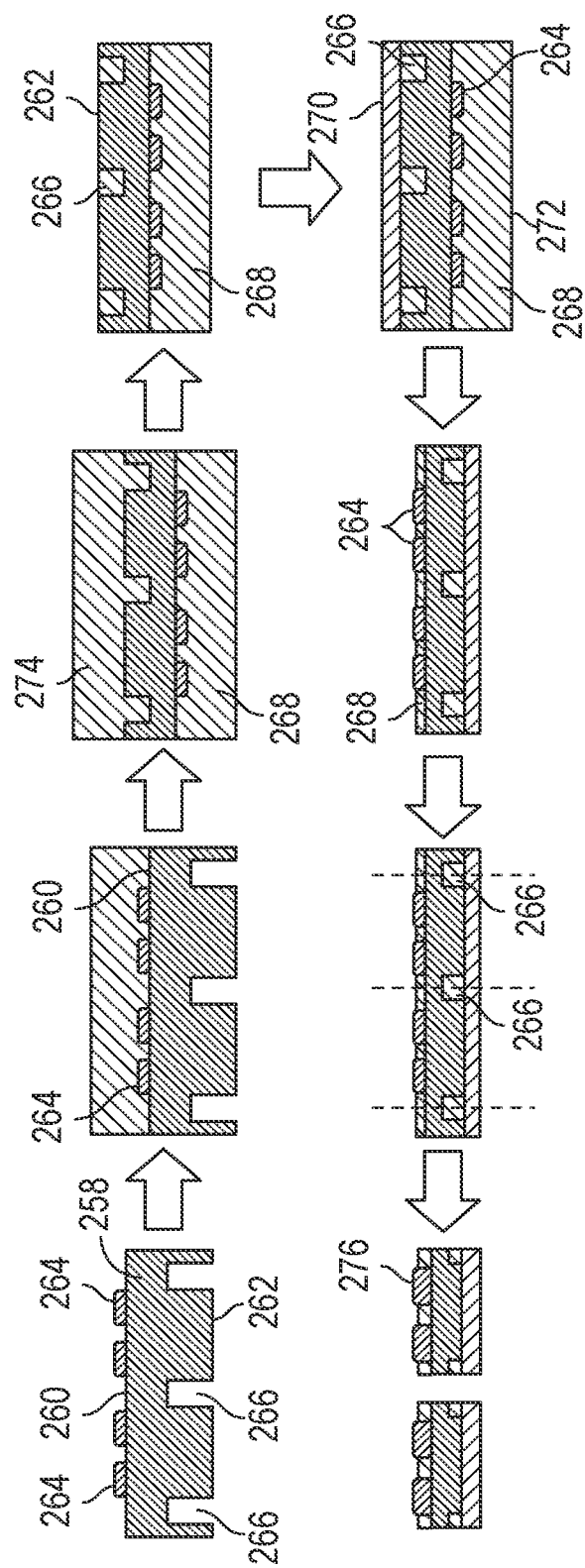
FIG. 23 is an illustration of a process flow for forming an ultra-thin semiconductor package with a portion of the die exposed.

Referring now to FIG. 23, another implementation of process flow for a method implementation for forming an ultra-thin semiconductor device with a portion of the die exposed is illustrated. The process flow illustrates cross sectional side views of the wafer and die. In various implementations, the method includes providing a wafer 258. The wafer 258 has a first side 260 and a second side 262. The wafer 258 may be, by non-limiting example, silicon, gallium nitride, silicon carbide, or other wafer substrate material disclosed herein. The first side 260 of the wafer 258 includes or is coupled to a plurality of electrical contacts 264. The electrical contacts 264 may be metallic or any other electrically conductive material disclosed herein.

In various implementations, the method for forming the ultra-thin semiconductor package includes forming a plurality of notches 266 in the second side 262 of the wafer 258. While not shown in FIG. 23, it is understood that the plurality of notches intersect one another in a substantially perpendicular direction. The notches 266 formed may be any depth previously disclosed herein, any shape previously disclosed herein, and formed using any method previously disclosed herein.

The method for forming the ultra-thin semiconductor package of FIG. 23 includes coating the first side 260 of the wafer 258 with a first molding compound 268. The first molding compound 268 may also cover the electrical contacts 264. The first molding compound 268 may be applied using any method previously disclosed herein, and may be any type previously disclosed herein. In various implementations, the first molding compound 268 may be cured or heat treated as described above in relation to FIG. 16.

In various implementations, the method for forming an ultra-thin semiconductor package may include grinding the second side 262 of the wafer 258 to a desired thickness. The second side of the wafer may be ground using any grinding method disclosed herein, and may be ground to any thickness described herein that still allows the notches to exist in the material of the wafer itself. In other implementations, the second side of the wafer is not ground.

The method of forming the ultra-thin semiconductor package as illustrated in FIG. 23 includes coating the second side 262 of the wafer 258 and the interiors of the plurality of notches 266 with a second molding compound 274. The second molding compound may be any type disclosed herein and may be applied and cured using any method described herein.

The method of forming the ultra-thin semiconductor package as illustrated in FIG. 23 includes grinding the second molding compound 274 to a desired thickness. In various implementations, the second molding compound is ground to expose the second side of the wafer 262. In various implementations, a portion of the wafer may be ground away with the second molding compound 274. At least a portion of the plurality of notches 266 remains after grinding the second molding compound 274. The second molding compound 274 may be ground using any grinding method disclosed herein.

In various implementations, the method for forming an ultra-thin semiconductor package includes forming a back metal 270 on the second side 262 of the wafer 258 and over the plurality of notches 266. The back metal may include a single metal layer or multiple metal layers. In various implementations, the back metal may include, by non-limiting example, gold, titanium, nickel, silver, copper, or any combination or alloy thereof.

Because the wafer 258 may be thinned and the back metal 270 is applied to the thinned wafer while the entirety of the first molding compound 268 is coupled to the front side 260 of the wafer 258, it reduces warpage of the wafer. Further, as discussed in this document, wafer handling issues are reduced when thinning the wafer and applying the back metal 270 because the entirety of the molding compound 268 is still coupled to the wafer 258.

In various implementations, the method for forming an ultra-thin semiconductor package includes exposing the plurality of electrical contacts 264 covered by the first molding compound 268 by grinding a first side 272 of the first molding compound. The first side 272 of the first molding compound 268 may be ground using any method disclosed herein.

In various implementations, the method for forming an ultra-thin semiconductor package includes singulating the wafer 258, first molding compound 268, and second molding compound 274 into single die 276. The wafer may be singulated by cutting or etching through the wafer where the plurality of notches 266 were originally formed. The wafer may be singulated by using, by non-limiting example, a saw, a laser, a waterjet, plasma etching, or chemical etching. In various implementations, the Bosch process may be used to singulate the wafer 258, first molding compound 268, and second molding compound 274 into individual die.

Figure 24:
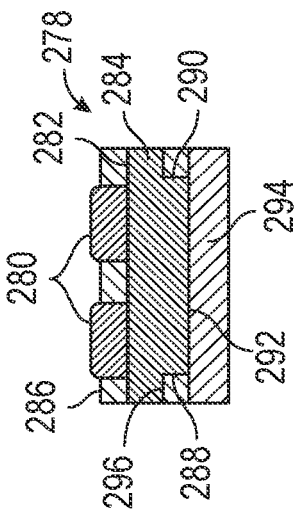
FIG. 24 is a cross sectional view of an ultra-thin semiconductor package formed by the process of FIG. 23.

Referring to FIG. 24, a cross sectional view of an ultra-thin semiconductor package formed by the process of FIG. 23 is illustrated. In various implementations, the ultra-thin semiconductor package 278 may include a power semiconductor device. Specifically, the ultra-thin semiconductor package may include a MOSFET. In other implementations, the ultra-thin semiconductor package 278 may not include a power semiconductor device. In various implementations, the ultra-thin semiconductor package 278 has a plurality of electrical contacts 280 coupled to the first side 282 of the die 284. In various implementations, the die 284 of the semiconductor package 278 may be between about 10-25 microns thick. In other implementations, the die 284 is less than about 10 microns thick. In still other implementations, the die 284 may be more than about 25 microns thick. As previously discussed, the ultra-thin nature of the power semiconductor device may improve the $R_{DS(ON)}$ of the device.

In various implementations, the ultra-thin semiconductor package 278 includes a molding 286 on a portion of a first side 282, a portion of a second side 288, a portion of a third side 290, a portion of a fourth side, and a portion of a fifth side of the die 284. A metal layer 294 may be coupled to the sixth side 292 of the die. In various implementations, more than one metal layer may be coupled to the sixth side 292 of the die. The metal may include, by non-limiting example, gold, titanium, nickel, silver, copper, or any combination or alloy thereof. In various implementations, a notch 296 cut out of the sixth side 292 of the die may extend around a perimeter of the die 284.

Figure 25:
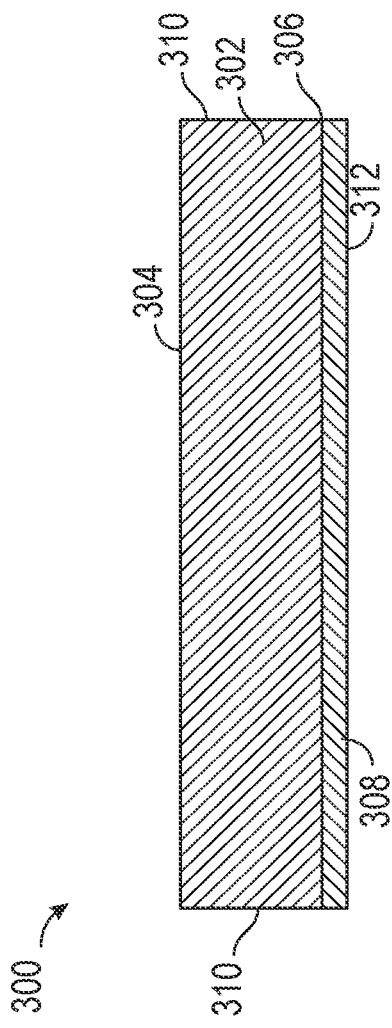
FIG. 25 is a cross sectional side view of a silicon-on-insulator (SOI) die.

Referring to FIG. 25, a cross sectional side view of an SOI die is illustrated. The SOI die 300 includes a silicon layer 302. The silicon layer 302 includes a first side 304 and a second side 306 opposite the first side. In various implementations, the silicon layer 302 may be, by non-limiting example, an epitaxial silicon layer, a polysilicon layer, a single crystal silicon layer, any combination thereof, or any other silicon-containing layer material. In other implementations, it is understood that a layer other than a silicon-containing layer may be used, such as, by non-limiting example, gallium arsenide, silicon carbide, or a metal-containing layer. While this disclosure primarily refers to silicon and SOI die, it is understood that the principles disclosed herein may be applied to other non-silicon containing die. In various implementations, one or more semiconductor devices may be coupled to the first side 304 of the silicon layer. In such implementations, the one or more semiconductor devices may include high voltage junction devices or power management devices, while in other implementations the one or more semiconductor devices may include other types of semiconductor devices.

In various implementations, the silicon layer 302 may be less than 35 micrometers (microns, um) thick. In other implementations, it may be 35 or more um thick. In particular implementations, the silicon layer 4 may be as thin as about 8 um thick. In implementations where the silicon layer 302 is to be used in medium voltage applications [100 volts (V) or 2 amps (A)], the silicon layer may be about 20-30 um thick. In other implementations where the silicon layer 4 is to be used in high voltage applications (1 kV, 10 A), the silicon layer may be greater than 100 um thick.

The SOI die also includes an insulative layer 308 coupled to the second side 306 of the layer 302. In various implementations, the insulative layer 308 may be coupled directly to the second side 306 of the layer 302. The insulative layer may include any electrical insulator, and in particular implementations, may include an electrical insulator which is thermally conductive. In particular implementations, the insulative layer may include, by non-limiting example, BN, AlN, $AlO_x$, $TiO_x$, $TiN_x$, $SiO_2$, sapphire (alpha-$Al_2O_3$), Mica, $Ta_2O_5$, diamond, $Si_xN_y$, SiC, GaN, graphene oxide, nanocomposite silicates, silicon rubber, a graphite polymer matrix, tungsten carbide, any other electrically insulative material, or any combination thereof. In implementations where the SOI die 300 is to be used in medium voltage applications [100 volts (V) or 2 amps], the insulative layer may be about 2,000-5,000 Angstroms (Å) thick. In other implementations where the SOI die 300 is to be used in high voltage applications (1 kV, 10 amps), the insulative layer may be about 1 um thick. In other implementations, the insulative layer may be less than 2 kÅ thick or more than 1 um thick. In particular implementations, the thickness of the insulative layer may be 3 um or more thick.

In various implementations, and as illustrated by FIG. 25, the sidewalls of the insulative layer 308 may be a continuous layer coextensive with the sidewalls 310 of the silicon layer 302. In other implementations, the insulative layer 308 may be patterned. Though not illustrated by FIG. 25, in various implementations the SOI die 300 may include a conductive layer directly coupled to the second side 306 of the layer 302. In particular implementations, the conductive layer may be between the layer 302 and the insulative layer 308. In implementations where the insulative layer 308 is patterned, the conductive layer may fill the recesses in the insulative layer. The conductive layer may also be patterned. In implementations including a conductive layer, the conductive layer may include titanium, aluminum, copper, gold, silver nickel, any other metal, any alloy thereof, or any combination thereof.

In various implementations, the insulative layer 308 is not coupled to any other layer or silicon layer aside from the silicon layer 302. While various implementations of SOI die include a layer of silicon over an insulative layer over a second layer of silicon (or at least a portion of a second layer of silicon), the implementations of the SOI die disclosed herein may only include a single silicon layer. In such implementations, this may allow for the second side 312 of the insulative layer 308 to be fully exposed. In particular implementations, the SOI die may only include a silicon layer 302 having a first side 304 and a second side 306 and an insulative layer 308 directly coupled to the second side 306 of the silicon layer 302. The insulative layer 308 may be patterned in various implementations. In other implementations, the SOI die may only include a silicon layer having a first side and a second side, a semiconductor device coupled to or formed on/in the first side of the silicon layer, and an insulative layer coupled directly to the second side of the silicon layer. In still other implementations, the SOI die may only include a silicon layer having a first side and a second side, an insulative layer coupled to the second side of the silicon layer, and a conductive layer directly coupled to the second side of the silicon layer as well as the insulative layer.

Figure 26:
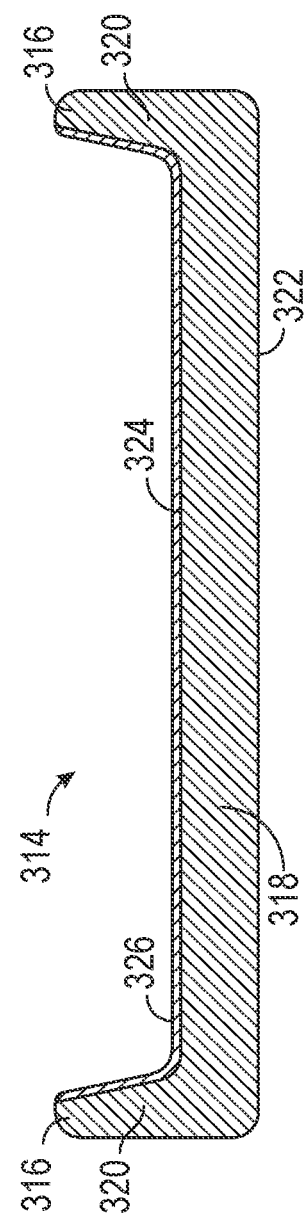
FIG. 26 is a cross sectional side view of an SOI substrate with a ring formed around the perimeter thereof.

Referring to FIG. 26, a cross sectional side view of an SOI substrate with a ring formed around the perimeter thereof is illustrated. In various implementations, the substrate 314 illustrated by FIG. 26 may be formed prior to forming the SOI die 300 illustrated by FIG. 25. The SOI substrate 314 includes a substrate 316 having a first side 322 and a second side 324. The substrate 316 may be, by non-limiting example, an epitaxial silicon substrate, a polysilicon substrate, single crystal silicon substrate, any combination thereof, or any other silicon-containing substrate material. In other implementations, it is understood that a substrate other than a silicon-containing substrate may be used, such as, by non-limiting example, gallium arsenide, silicon carbide, or a metal-containing substrate. While this disclosure primarily refers to silicon and SOI substrates, it is understood that the principles disclosed herein may be applied to other non-silicon containing substrates. As illustrated by FIG. 26, the substrate 316 includes a thinned portion 318 and a ring 320 extending around the perimeter of the substrate. The ring may result from backgrinding in a process marketed under the trade name TAIKO by DISCO of Tokyo, Japan. The thinned portion 318 of the substrate 316 may be less than 35 micrometers (um) thick. In other implementations, it may be 35 or more um thick. In particular implementations, the thinned portion 318 of the substrate 316 may be as thin as about 8 um thick. In other particular implementations, the thinned portion 318 of the substrate may be about 20-30 um thick.

The SOI substrate 314 includes an insulative layer 326 coupled to the second side 324 of the substrate 316. In various implementations, the insulative layer 326 may be coupled directly to the second side 324 of the substrate 316. The insulative layer may include any electrical insulator, and in particular implementations, may include an electrical insulator which is thermally conductive. In particular implementations, the insulative layer may include, by non-limiting example, BN, AlN, $AlO_x$, $TiO_x$, $TiN_x$, $SiO_2$, sapphire (alpha-$Al_2O_3$), Mica, $Ta_2O_5$, diamond, $Si_xN_y$, SiC, GaN, graphene oxide, nanocomposite silicates, silicon rubber, a graphite polymer matrix, tungsten carbide, any other electrically insulative material, or any combination thereof. In various implementations, the insulative layer 326 may be about 2,000-5,000 Angstroms (Å) thick. In other implementations, the insulative layer 326 may be about 1 um thick. In still other implementations, the insulative layer 326 may be less than 2 kÅ thick, more than 1 um thick, or between 2 kÅ and 1 um thick. In particular implementations, the insulative layer may be 3 um or more than 3 um thick. In various implementations, and as illustrated by FIG. 26, the insulative layer 326 may be a solid and continuous layer covering the second side 324 of the substrate 316. In other implementations, the insulative layer 326 may be patterned. In various implementations, the insulative layer 326 is not coupled to any other substrate aside from the substrate 316.

In various implementations, the SOI substrate 314 may also include a conductive layer coupled to the insulative layer 326 and to the second side 324 of the substrate 316 (not illustrated in FIG. 26). In various implementations, the conductive layer may be directly coupled to the second side 324 of the substrate 316. In particular implementations, the conductive layer may be between the substrate 316 and the insulative layer 326. In implementations including a conductive layer, the conductive layer may any type of material previously disclosed herein and may or may not be patterned.

Figure 27:
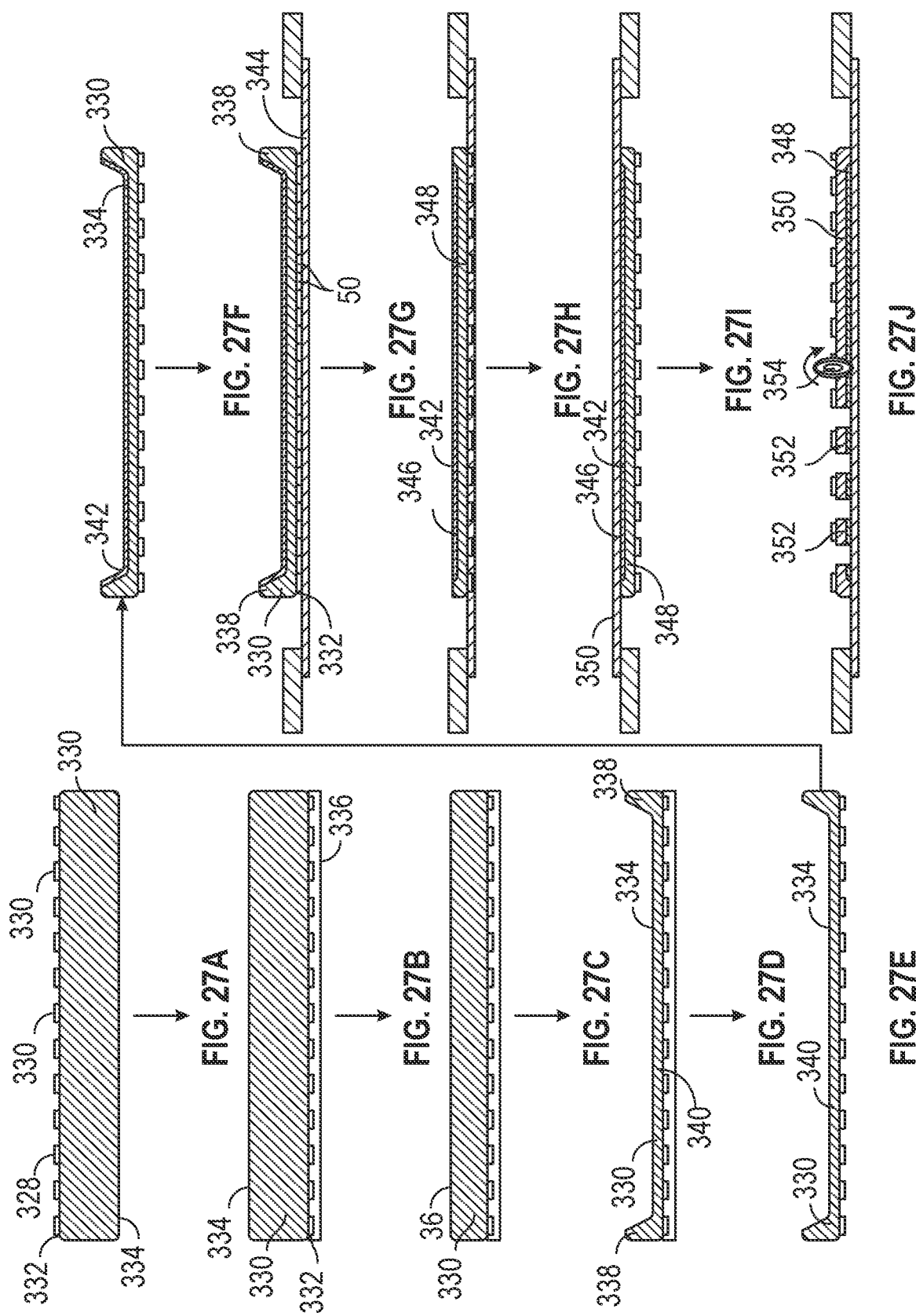
FIGS. 27A-27J are cross sectional side views of an implementation of a method of forming an SOI die.

Referring to FIGS. 27A-27J, cross sectional side views of a substrate at various points of a method for forming an SOI die is illustrated. Referring specifically to FIG. 27A, the method for forming an SOI die may include forming a plurality of semiconductor devices 328 on, or coupling a plurality of semiconductor devices 328 to, a first side 332 of a substrate 330. While FIGS. 27A-27J indicate that the plurality of semiconductor devices 328 are formed on the substrate 332 before thinning the substrate and/or before applying an insulative layer, in other implementations, the plurality of semiconductor devices may be formed on the substrate after thinning the substrate and/or after applying an insulative layer to the substrate. The plurality of semiconductor devices may be any type of semiconductor device disclosed herein.

Referring to FIG. 27B, the method for forming an SOI die may include applying backgrind tape 336 to the first side 332 of the substrate 330. Referring to FIG. 27C, the method may also include initially thinning the substrate 330. In various implementations, the substrate may be initially thinned to about 35 um, though in other implementations the substrate may be thinned to more or less than this thickness. The substrate 330 may be thinned through backgrinding, etching, or any other thinning technique.

Referring to FIG. 27D, the method for forming an SOI die includes forming a ring 338 around the perimeter of a second side 334 of a substrate 330 through backgrinding the second side of the substrate 330 to a desired substrate thickness. In particular implementations, the backgrinding may use a process marketed under the trade name TAIKO by DISCO Corporation of Tokyo, Japan. The backgrinding leaves a ring of non-removed material (TAIKO ring) along the perimeter of the second side 334 of the substrate 330 which helps to prevent the substrate from curling, warping or otherwise bending during further processing while at the same time removing most of the thickness and material of the second side 334 of the substrate 330. The ring 338 may also offer sufficient stress management for the insulative layer applied to the substrate as described later herein. In other implementations of methods of forming semiconductor devices the TAIKO process may not be used, but another backgrinding or other material-removal technique may be used, such as removing the material through a wet etch. In various implementations, the thinned portion 340 of the substrate 330 may be 50 um thick. In other implementations, it may be more or less than 50 um thick, including any die or substrate thickness previously disclosed herein.

Referring to FIG. 27E, the method for forming an SOI die may include etching the second side 334 of the substrate 330, or the thinned portion 340. In particular implementations, the etching may be stress relief etching. This stress relief etching may be used to obtain the final desired thickness of the wafer. The stress relief etching may include wet chemical etching. In other implementations, it may include dry etching or polishing instead of wet chemical etching, however, wet chemical etching may result in a cleaner substrate with less residual particles. Acid may be used to etch the substrate, and in various implementations may include, by non-limiting example, hydrofluoric acid, acetic acid, nitric acid, and any other acid or combination thereof. The wet chemical etch may be tightly monitored and controlled so that the targeted thickness of the wafer is achieved. In various implementations, the second side 334 of the substrate 330 may be etched until the thinned portion 340 of the substrate is 25 um thick. In other implementations, the substrate 330 may be etched until thinned portion 340 is more or less than 25 um thick. In implementations where the substrate is wet etched, the wet etch may prepare the substrate to better adhere to later deposited materials and/or devices. In various implementations, the backgrind tape 336 may be removed.

Referring to FIG. 27F, the method for forming an SOI die includes depositing an insulative layer 342 onto the second side 334 of the substrate 330 after backgrinding. In various implementations, the insulative layer 342 may be deposited at a low temperature. The low temperature deposition may allow for the insulative layer to be deposited without overheating the substrate, especially in instances where the substrate has been thinned. The substrate 330 may have a low thermal resistance. In various implementations, the insulative layer may be deposited through spin-on techniques, chemical vapor deposition (CVD), sputtering, evaporation, co-sputtering, or co-evaporation, and in particular implementations, may be deposited at a temperature that does not require heat dissipation. In implementations where the insulative layer is deposited using either co-sputtering or co-evaporation, the overall performance of the SOI die and the adhesion of the insulative layer 342 to the substrate 330 may be improved. In various implementations, however, the method may include dissipating heat through a heat dissipation device during deposition of the insulative layer 342. The heat dissipation device may include, among other devices, cooling chucks or common evaporators. The insulative layer 342 may be any insulative material previously disclosed herein, and may be applied in any thickness previously disclosed herein. In the implementation illustrated by FIG. 27F, the method includes depositing the insulative layer 342 directly to the second side 334 of the substrate 330. In other implementations, the method may include directly depositing a conductive layer to the second side of the substrate prior to deposition of the insulative layer. The conductive layer may enhance the adhesion between the insulative layer and the substrate as well as provide potential electrical contacts on the substrate. In such implementations, the conductive layer may include any electrically conductive material disclosed herein. In various implementations, the conductive layer may be deposited through, by non-limiting example, sputtering, evaporation, electroplating, any other deposition technique, or any combination thereof.

Referring to FIG. 27G, the method for forming an SOI die includes mounting the substrate 330 to a film frame. The first side 332 and/or the plurality of semiconductor devices 328 may be directly coupled to the film frame 344. Referring to FIG. 27H, the method may include removing the ring 338. The ring may be removed through grinding the ring portion of the substrate. In other implementations, the ring may be removed through plasma etching or cutting the ring from the remaining substrate using, by non-limiting example, a laser or a saw. In various implementations, the ring is removed to the extent that the backside 346 of the SOI substrate 348 opposite the side of the SOI substrate coupled to the film frame is substantially level.

Referring to FIG. 27I, the method for forming an SOI die includes applying a final dicing tape 350 to the backside 346 of the SOI substrate 348, or to the insulative layer 342. In such implementations, the method may also include removing the exposed tape used to couple the substrate 330 to the film frame explained in FIG. 27G. In other implementations, rather than applying the final dicing tape, the SOI substrate may be flipped so the insulative layer 342 is directly coupled to the existing tape.

Referring to FIG. 27J, the method for forming an SOI die may include singulating the substrate 330 (and the SOI substrate 348) into a plurality of SOI die 352. The SOI substrate may be singulated through, by non-limiting example, a saw 354, a laser, plasma etching, or any other singulation device or method. In various implementations, the SOI die may be coupled to an interposer after singulation.

Figure 28:
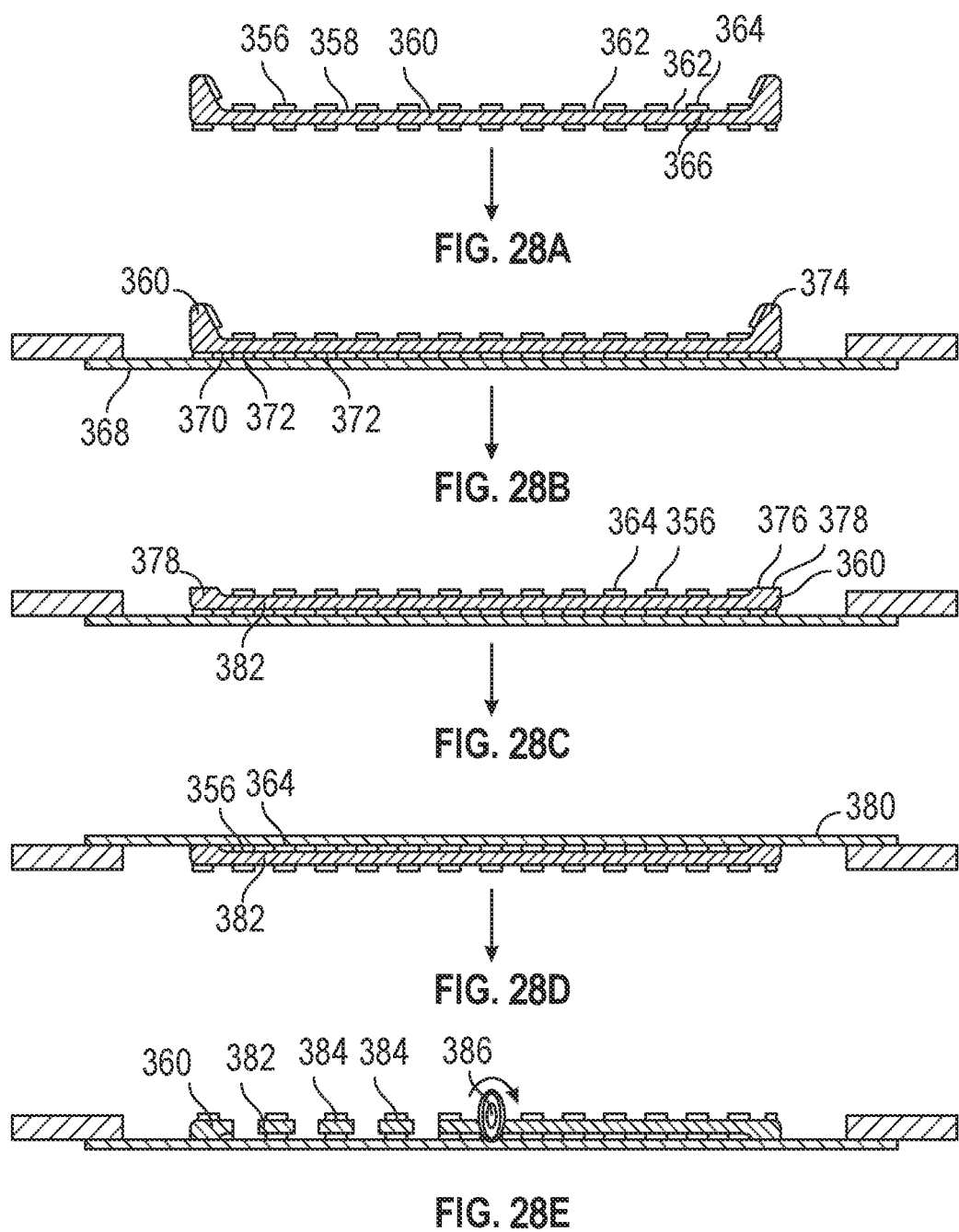
FIGS. 28A-28E are cross sectional side views of a second implementation of a method of forming an SOI die.

Referring to FIGS. 28A-28E, cross sectional side views of a second implementation of a method for forming an SOI die are illustrated. Referring specifically to FIG. 28A, the method may include patterning an insulative layer 356 coupled to a second side 358 of a substrate 360. As illustrated, the substrate 360 has been thinned to form a ring using any of the thinning methods disclosed in this document. In such implementations, the method includes masking the insulative layer and removing portions of the insulative layer where the mask pattern is absent. The SOI substrate 360 may be the same as or similar to the SOI substrate illustrated in FIG. 27F with the exception that the insulative layer 356 is patterned. The process used to produce the SOI substrate illustrated by and described in relation to FIG. 27F may also be used in making the SOI substrate with the patterned insulative layer illustrated in FIG. 28A.

In the implementation illustrated by FIG. 28A, the method includes depositing the insulative layer 356 directly onto the second side 358 of the substrate 360. In other implementations, the method may include directly depositing a conductive layer onto the second side of the substrate prior to deposition of the insulative layer. The conductive layer may enhance the adhesion between the insulative layer and the substrate as well as provide potential electrical contacts on the substrate. The conductive layer may be patterned. In still other implementations, the conductive layer may be deposited within recesses 362 formed in the patterned insulative layer 356. The conductive layer may also cover all of or a portion of a second side 364 of the insulative layer 356 opposite the first side 366 of the insulative layer. The conductive layer may include any conductive material disclosed herein. In various implementations, the conductive layer may be deposited through, by non-limiting example, sputtering, evaporation, electroplating, any other deposition technique, or any combination thereof.

Referring to FIG. 28B, implementations of a method for forming an SOI die includes mounting the substrate 360 to a film frame 368. The first side 370 and/or the plurality of semiconductor devices 372 may be directly coupled to the film frame 368. Referring to FIG. 28C, the method may include removing the ring 374. The ring 374 may be removed through grinding the ring portion of the substrate or any other method disclosed in this document. In various implementations, the ring is removed to the extent that the second side 376 of the substrate 360 on the ends 378 of the substrate are substantially level with the second side 364 of the insulative layer 356.

Referring to FIG. 28D, the method for forming an SOI die may include applying a final dicing tape 380 to the second side 364 of the insulative layer 356. In such implementations, the method may also include removing the exposed tape used to couple the substrate 360 to the film frame 368 as explained in relation to FIG. 28B. In other implementations, rather than applying the final dicing tape, the SOI substrate 382 may be flipped so the insulative layer 356 is directly coupled to the existing tape.

Referring to FIG. 28E, the method for forming an SOI die includes singulating the substrate 360 (and the SOI substrate 382) into a plurality of SOI die 384. The SOI substrate 382 may be singulated through, by non-limiting example, a saw 386, a laser, plasma etching, or any other singulation device or method. In various implementations, the SOI die may be coupled to an interposer after singulation.

The implementations of SOI substrates and SOI die disclosed herein may be formed without using a process that implants hydrogen within a substrate, without forming bubbles within the substrate, without breaking the substrate, and/or without having to polish the substrate. Further, the method may be performed without using a sacrificial carrier substrate and without having to cut, grind, or otherwise remove the sacrificial carrier substrate. The methods of forming such implementations of SOI die may have sufficient stress management of the backside insulating material to be able to form an SOI die without a sacrificial carrier substrate while still having a thin silicon layer coupled to the insulative layer. In this way, no remaining carrier material may be present in the resulting SOI die.

Figure 50:
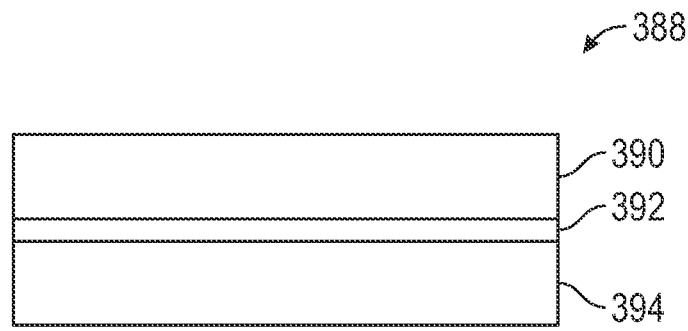
FIG. 50 is a side view of an implementation of a SOI die.

Referring to FIG. 50, a side view of an implementation of a SOI die 388 is illustrated. In this implementation, the SOI die 388 includes a silicon layer 390 coupled over an insulative layer 392. The silicon layer 390 may be made of any silicon material disclosed in this document and the insulative layer 392 may be made of any insulative material disclosed herein. The insulative layer 392 is coupled to a die support structure 394, which in various implementations may be a permanent die support structure or a temporary die support structure.

As illustrated with reference to FIGS. 50 and 51, the silicon layer 390 and the insulative layer 392 of the SOI die 388 collectively form a first largest planar surface 396 and a second largest planar surface 398 with thickness 400 between them. As illustrated, the thickness 400 is formed of the thickness of the silicon layer 390 and the thickness of the insulative layer 392. Because the shape formed by the SOI die 388 is a rectangle, four additional sides extend across the thickness 400. As illustrated, the shape of the temporary die support 394 is that of an ellipse (oval in this case).

In various implementations disclosed herein, the thickness 400 of the SOI die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, the thickness may be less than 10 microns.

The groups of various SOI die disclosed herein may have various sizes (die sizes). Die size generally refers to measured principal dimensions of the perimeter of the shape formed by an SOI die. For example, for a rectangular SOI die that has a perimeter shaped like a square, the die size can be represented by referring to a height and width of the perimeter. In various implementations, the die size may be at least about 6 mm by about 6 mm where the perimeter of the SOI die is rectangular. In other implementations, the die size may be smaller. In other implementations, the die size of the SOI may be about 211 mm by about 211 mm or smaller. For a die with a perimeter that is not rectangular, the surface area of the largest planar surface of the SOI die may be used as a representation of the die size.

One of the effects of thinning the SOI die during the various methods of forming an SOI die disclosed herein is that as the thickness decreases, the largest planar surfaces of the SOI die may tend to warp or bend in one or more directions as the thinned material permits movement of the material under various forces. Similar warping or bending effects may be observed where the die size becomes much larger than the thickness of the SOI die for large groups of die above about 6 mm by about 6 mm or 36 mm$^2$ in surface area. These forces include tensile forces applied by stressed films, stress created through backgrinding, forces applied by backmetal formed onto a largest planar surface of the die, and/or forces induced by the structure of the one or more devices formed on and/or in the SOI die. This warping or bending of the SOI semiconductor die can prevent successful processing of the SOI die through the remaining operations needed to form a semiconductor package around the SOI die to allow it to ultimately function as, by non-limiting example, a desired electronic component, processor, power semiconductor device, switch, or other active or passive electrical component. Being able to reduce the warpage below a desired threshold amount may permit the SOI die to be successfully processed through the various operations, including, by non-limiting example, die bonding, die attach, package encapsulating, wire bonding, epoxy dispensing, pin attach, pin insertion, or any other process involved in forming a semiconductor package. In various implementations the warpage of the SOI die may need to be reduced to less than about 50 microns measured across a largest planar surface of the die between a highest and lowest point on the largest planar surface. In other implementations, by non-limiting example, where an assembly process involves Au—Si eutectic die attach, the warpage of the SOI die may need to be reduced to less than about 25 microns when measured across a largest planar surface of the die. In other implementations, by non-limiting example, where a die attach process utilizing solder paste is used, the warpage of the SOI die may need to be reduced to about 75 microns or less. In various implementations, the warpage of the die may be reduced to below about 200 microns or less. In implementations where larger die are used, more warpage may be tolerated successfully in subsequent packaging operations, so while values less than 25 microns may be desirable for many die, depending on die size, more warpage than about 25, than about 50, than about 75 microns, or up to about 200 microns may be capable of being tolerated.

In various implementations, the warpage may be measured using various techniques. For example, a capacitive scanning system with two probes that utilize changes in the capacitance for each probe when a die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, New York. In other implementations, the warpage may be measured by a laser profilometer utilizing confocal sensors marketed under the tradename ACUITY by Schmitt Industries, Inc. of Portland, Oregon. In other implementations, any of the following shape/profile measurement systems marketed by Keyence Corporation of America of Itasca, Illinois could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

Figure 51:
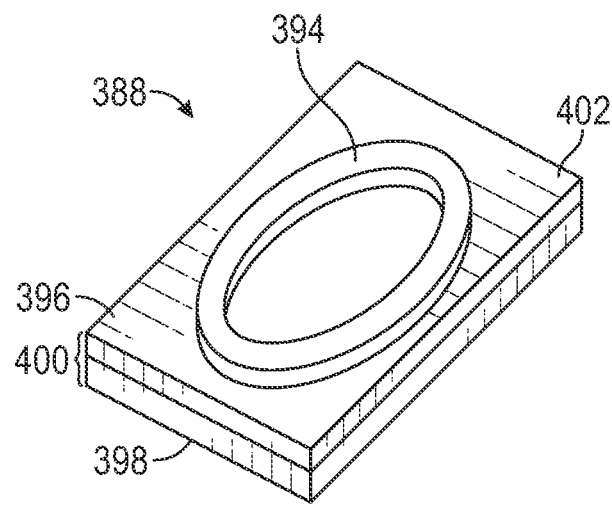
FIG. 51 is a perspective view of an implementation of an SOI with a temporary die support coupled thereon.

Referring to FIG. 51, in various implementations of die support structures (die supports), a die may be coupled to and coextensive with a perimeter 402 of a largest planar surface 396 of the SOI die 388. However, and as described in this document, the shape of the perimeter 402 may be a wide variety of shapes, including, by non-limiting example, rectangular, triangular, polygonal, elliptical, circular, or any other closed shape.

While in the implementation illustrated in FIGS. 50 and 51 the die support structure 394 is a temporary die support structure, in other implementations of die support structures disclosed in this document, the die supports structures may be permanent. In implementations of a temporary die support structure, the die support is designed to be removably/releasably coupled to the SOI die 388 and reduce the warpage of the SOI die during die packaging operations.

In the implementations illustrated in FIGS. 50 and 51 and in this document permanent and temporary die support structure structures each include a material that is applied to the first largest planar surface of an SOI die. The material reduces the warpage of the SOI die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the SOI die. While a single layer of material is illustrated as being used as the temporary die support in FIGS. 50 and 51, in other implementations two or more layers of material may be employed to form the die support which contain either the same or different material compositions. These two or more layers may be applied simultaneously or sequentially in various implementations.

A wide variety of forms of materials may be employed in various implementations of temporary die supports, including, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releasably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releasably coupled with a semiconductor die.

In various implementations, the material of the permanent die supports disclosed in this document may be mold compounds. In these implementations, the mold compound is not a polyimide material or other material generally specifically used to act as a passivating material for a semiconductor die surface. The mold compound may include any of a wide variety of compounds, including, by non-limiting example, encapsulants, epoxies, resins, polymers, polymer blends, fillers, particles, thermally conductive particles, electrically conductive particles, pigments, and any other material capable of assisting in forming a stable permanent supporting structure. In some implementations the mold compound may be non-electrically conductive (insulative). In other implementations, the mold compound may be electrically conductive, such as an anisotropic conductive film. In such implementations where the mold compound is electrically conductive, the mold compound is not a metal, but rather is formed as a matrix containing electrically conductive materials, such as, by non-limiting example, metal particles, graphene particles, graphite particles, metal fibers, graphene fibers, carbon fibers, carbon fiber particles, or any other electrically conductive particle or fiber. In various implementations, the mold compound may be a material which has a flexural strength of between about 13 N/mm$^2$ to 185 N/mm$^2$. Flexural strength is the ability of the mold compound to resist plastic deformation under load. Plastic deformation occurs when the mold compound no longer will return to its original dimensions after experiencing the load. For those implementations of permanent die support structures, flexural strength values of the mold compound to be used may generally be selected so that the chosen mold compound has sufficient flexural strength at the maximum expected operating temperature to avoid plastic deformation.

A wide variety of shapes and structures may be employed as permanent or temporary die support structures in various implementations that may employ any of the material types, material forms, material parameters, or film parameters disclosed in this document to reduce the warpage of an SOI die to any of the desired levels disclosed in this document.

For example, in various implementations, implementations of permanent or temporary die support structures may coupled at the thickness of an SOI die. In some implementations, the permanent or temporary die support structure may extends continuously around the thickness/perimeter of the SOI die. In other implementations of permanent or temporary die support structures may include two C-shaped or U-shaped portions, a first portion and a second portion. The first portion and second portion may be separated by a gap along each side of the SOI die. The material of the die support structure in such an implementation is included in the first portion and second portion and may be any material disclosed for use in a permanent or temporary die support structure disclosed in this document. In other implementations, the two C-shaped or U-shaped portions may alternatively be coupled across or over the thickness of the SOI die. In other implementations, the U- or C-shaped first portion and second portion may be coupled to the lower largest planar surface of the SOI die rather than the upper largest planar surface.

In various implementations of SOI die, more than one die may be coupled together through a permanent or temporary die support (where the die are physically separate from each other) or a group of more than one die may be supported by a permanent or temporary die support (where the die remain coupled to each other through die streets). In various implementations, the group of physically separate or joined die could include where at least one of the die has a different individual die and the group has a non-rectangular shape to its perimeter. Various temporary or permanent die supports may then be coupled to the largest planar surfaces or the thickness of the group of die. The temporary or permanent die supports are then used to maintain the warpage of the group of SOI die below a desired value. Any of the temporary or permanent die support implementations disclosed in this document may be employed with a group of SOI die (whether composed of physically separate SOI die or SOI die still joined through die streets).

In various implementations of permanent or temporary die supports may be formed of two intersecting lines of material, which may be symmetric in at least one axis. In other implementations, however, the shape of the die support structures may be asymmetric about one or all axes. The locations along the upper or lower planar surfaces of the SOI die at which the structure is coupled to the die may be determined by calculations based on, by non-limiting example, individual die size, individual die surface area, individual die shape, localized film properties, localized stress gradients, location(s) of semiconductor devices on/within the die, die thickness, die thickness uniformity, and any other parameter affecting the warpage of an individual semiconductor die. Also, in various implementations, the length, orientation, and or position of each of the projections of a permanent or temporary die structure may be calculated and/or determined using any of the previously mentioned parameters affecting the warpage of an SOI die. While in the implementation of a die support illustrated in FIG. 51 the die support is illustrated with substantially straight side walls, in other implementations, the dies support may have rounded side walls. In various implementations, the side wall profile of the temporary or permanent die supports disclosed herein may be calculated/determined using any of the previously mentioned parameters that affect the warpage of an SOI die disclosed in this document.

Various permanent and temporary die support implementations may take the form of a rod/long rectangle with straight or substantially straight side walls. As previously discussed, the profile of the side walls may be changed (rounded, etc.) to assist in reducing the warpage of an SOI die as can the location of the support and its orientation relative to the perimeter of the die. In various implementations, the rod may not be straight, but may be curved in one or more places to form, by non-limiting example, a C-shape, a U-shape, an S-shape, an N-shape, an M-shape, a W-shape, or any other curved or angled shape formed from one continuous piece of material.

In other implementations of permanent or temporary die supports like those disclosed in this document, die support structures with a central portion from which a plurality of ribs project may be utilized. The number, location, and position of the ribs along the central portion may be determined/calculated using any of the previously discussed parameters that affect the warpage of the group of die. The side wall profile of any or all of the ribs and/or the central portion may also be calculated in a similar way using the previously discussed parameters.

In various implementations, the temporary or permanent die support need not be a shape with straight edges/lines, but, like the implementation of a temporary die support 394 illustrated in FIG. 51, may include an elliptical or spherical shape. In this implementation, the overall three-dimensional shape of the die support 394 is that of a rounded ring with straight side walls. In other implementations, however, the overall three-dimensional shape of the support 394 may be, by non-limiting example, a ring with straight or substantially straight sidewalls, cylindrical with straight side walls, conical with angled side walls, frustoconical with straight side walls and a flat upper surface, or any other three dimensional shape that is formed by projecting an elliptical cross-sectional shape upward from the surface of an SOI die.

In various implementations of temporary or permanent die supports, various triangular shapes may be utilized. For those supports that are triangular, the shape of the triangle may be acute, right, obtuse, equilateral, isosceles, or scalene in various implementations. As in the previously discussed, the side wall profile of the triangle and the placement of the die support along the largest planar surface of an SOI die may be determined by any of the previously mentioned parameters that affect the warpage of die.

In various implementations of temporary or permanent die supports the shape of the die support may be irregular as determined by what is calculated to minimize the warpage of an SOI die. In various implementations, the die support may be designed to contact the SOI die but in non-symmetric or otherwise varying locations in order to minimize the warpage of the largest planar surface of the SOI die. The side wall profile of the die support, like previously discussed, may be rounded or straight as determined by what is needed to minimize the warpage of the largest planar surface.

In various implementations, the permanent or temporary die support can include more than one portion that is not directly attached to any other portion. In various implementations, the specific placement, sizing, and side wall profile of each of the portions may be determined by any of the previously mentioned parameters affecting warpage of a group of die. Where first portions and second portions may be are coupled to the largest planar surface, in other implementations the first and second portions may be coupled on/at the thickness of an SOI die. In some implementations, first, second, third, and fourth portions may be coupled around each corner of an SOI die at its thickness. In other implementations, four portions may be included but may be coupled at the thickness at the midpoint of each side of the SOI die. In various implementations, portions coupled at the thickness may take a variety of other shapes, including, by non-limiting example, semicircular, triangular, square, angled, or any other closed shape. In other implementations, a single permanent or temporary die support structure may be coupled along a side of the SOI die at the thickness; in others, the single permanent or temporary die support structure may be coupled on a side and may wrap around one or more corners of the SOI die.

In various implementations of permanent and temporary die supports, the die support may take the form of a frame with one or more curved sections extending across the largest planar surface of the SOI die. The radius of curvature of the one or more curved sections may be determined by any of the various parameters that govern warpage disclosed in this document. While the one or more curved sections may be symmetrically distributed about the frame, in various implementations they may be, by non-limiting example, asymmetric about one or more axes, have different radii of curvature, extend from any side of the frame, include one or more sections, extend nearly across the dimension of the frame, or be placed as determined by any of the parameters that control warpage of SOI die disclosed in this document.

In various implementations of permanent die supports like those disclosed herein, a permanent die support material may fully enclose both of the largest planar surfaces and the thickness of an SOI die. Whether the die support fully encloses all six sides of an SOI die depends on the desired warpage values. In such implementations where the permanent die support completely covers one or more sides of the SOI die, one or more openings may be provided in/formed in the permanent die support through the material of the permanent die support to allow electrical or physical connections with one or more of the SOI die. In various other implementations, permanent or temporary die support material may extend over the thickness and one of the two largest planar surfaces of the SOI die. In such implementations, electrical and physical connections made be formed via the exposed largest planar surface and/or through openings in the material of the die support. A wide variety of possible configurations may be constructed to form electrical and physical connections with an SOI die to which a permanent or temporary die support like any disclosed in this document using the principles disclosed herein. In various implementations, the permanent die support material may be conformal, or conform to the shape of the die over which the material is coupled. In other implementations, the die support material may be non-conformal forming its own shape rather than assuming part of the shape of the die. In various implementations, the permanent die support material may be applied as a coating to the SOI die.

In various implementations, a thickness of the permanent or temporary die support material may be thinner than a thickness of the SOI die. In other implementations, a thickness of the die support material may be thicker than a thickness of the SOI die. The particular thickness and uniformity of the thickness of the die support material over the surfaces of the SOI die may be determined using any of the factors influencing the warpage of a SOI die disclosed herein.

In various implementations of a method of forming an SOI die, the temporary or permanent die supports may be coupled prior to or after probing of the individual die/groups of SOI die. Similarly, the temporary or permanent die supports may be applied to a plurality of die on a SOI substrate prior to or after probing the plurality of die/groups of die.

Figure 49:
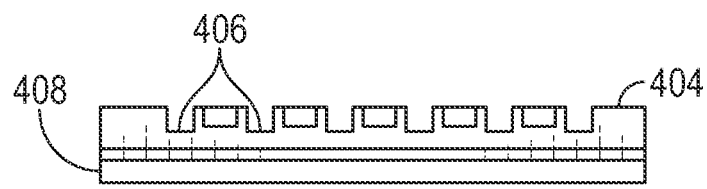
FIG. 49 is a cross sectional side view of an implementation of a SOI substrate showing die streets therein and a temporary die support coupled thereto.

In various method implementations, no precut or partial grooving between the plurality of die of an SOI substrate (or groups of die) may be carried out. Where the plurality of die (or groups of die) will be thinned, the depth of the die/saw streets/scribe lines may be sufficient to carry out the various methods of forming semiconductor packages disclosed herein. For example, and with reference to FIG. 49, where the SOI substrate 404 will be thinned to about 10 microns, the about 5 micron depth of the die streets 406 into the material of the substrate/die resulting from the processing steps that form the groups of semiconductor die suffices to act as the equivalent of any partial grooving/precutting. In various implementations, as illustrated in FIG. 49, permanent or temporary die support structures 408 may be applied over some of the die streets of the SOI substrate leaving specific die streets exposed for subsequent processing.

In particular method implementations, the depth of the die streets can be increased during the SOI die fabrication process. In other particular method implementations, the depth of the exposed die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into an SOI substrate may reduce the partial sidewall coverage for each SOI die, the benefits may outweigh the additional coverage in various method implementations.

In various method implementations, temporary or permanent die support structures may be coupled to the plurality of SOI die while the semiconductor substrate while it is at full thickness, or, in other words, prior to any thinning operations being performed. Additional thinning operations can then be initiated with the temporary or permanent die support structures in place. Also, for those processes where precut/grooving operations take place prior to thinning, these steps can take place after coupling of the temporary or permanent die support structures.

In various method implementations, and as discussed further in this document, temporary or permanent die support structures may be coupled over the SOI die after thinning is performed. In other implementations, the temporary or permanent die support structures may be applied over the SOI die after backmetal layer(s) have been applied to the semiconductor substrate. In yet other method implementations, the temporary or permanent die support structures may be applied over the SOI die after the semiconductor substrate has been only partially thinned, such as, by non-limiting example, through removing backside oxide prior to probing, an initial grinding step prior to a polishing/lapping step, or any other process which partially removes a layer of material or bulk material from the side of the semiconductor substrate opposite the SOI die.

In various method implementations, the temporary or permanent die support structures may be applied over the SOI die after a full backgrinding process is carried out but prior to or after a stress relief wet etching process has been carried out. In some implementations, the stress relief wet etching may take place after protecting the front side (die side) of the semiconductor substrate. The stress relief etching may reduce the backside damage to the SOI substrate that is caused by the backgrinding process. The use of the stress relief etching may also facilitate adhesion of backmetal applied to the ground surface. In various implementations, the application of the temporary or permanent die support structures may be carried out prior to a backmetal formation process. A wide variety of sequences of method steps involving coupling of temporary or permanent die support structures may be carried out using the principles disclosed in this document for packaging process involving wafer scale operations like those disclosed in this document used for SOI substrates. The stress relief etching used may be carried out using any method disclosed in this document.

Figure 34:
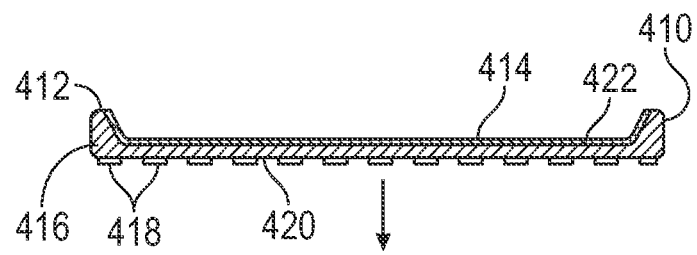
FIG. 34 is a cross sectional side view of an SOI substrate.
Figure 35:
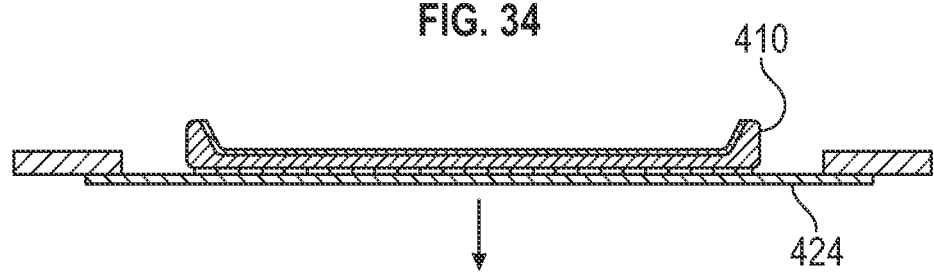
FIG. 35 is a cross sectional side view of the SOI substrate after mounting to a tape.
Figure 36:
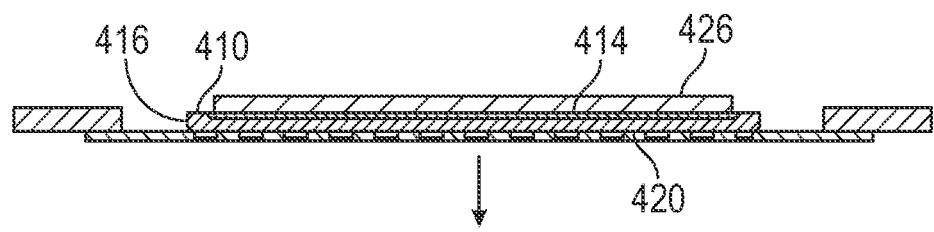
FIG. 36 is a cross sectional side view of the SOI substrate after forming a permanent die support thereon and removal of a ring.

Referring to FIG. 34, a cross sectional side view of an SOI substrate 410 is illustrated. In this implementation, the SOI substrate 410 has already been processed using the method implementations previously disclosed in this document with reference to FIGS. 27A-E and an edge ring (ring) 412 has been formed and an insulative layer 414 applied the thinned and stress relief etched second side 422 of the silicon substrate 416. A plurality of die 418 have been formed in/on a first side 420 of the silicon substrate 416. FIG. 35 illustrates the substrate 410 mounted to a tape 424 which may be, by non-limiting example, a support tape, support film, or dicing tape in various implementations. FIG. 36 illustrates the substrate 410 after removal of the ring 412. In various implementations, the ring 412 may be removed through any of the methods disclosed in this document either completely through sawing or grinding to the level of the second side 422 of the silicon substrate 416 or partially, leaving part of the material of the raised portion of the ring behind. FIG. 36 also illustrates a permanent die support 426 coupled to the insulative layer 414. The material employed in the permanent die support 416 may be any disclosed in this document. While the particular permanent die support 416 illustrated in FIG. 36 is a layer of material formed over the insulative layer 414, in other implementations, any of the other die support shapes disclosed in this document may be applied over each SOI die, group of SOI die, or the SOI substrate 410. While in the method implementation illustrated, the permanent die support 416 is illustrated being coupled to the second side of the SOI substrate 410, in other method implementations the die support (permanent or temporary) may be coupled to the first side 420 of the substrate 410. In some implementations, two die supports (permanent, temporary, or any combination) may be coupled to the SOI substrate 410, one on both sides of the substrate.

Figure 37:
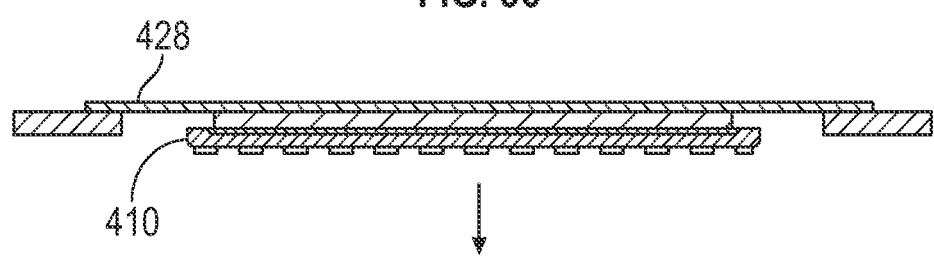
FIG. 37 is a cross sectional side view of the SOI substrate after flipping and mounting to a dicing tape.
Figure 38:
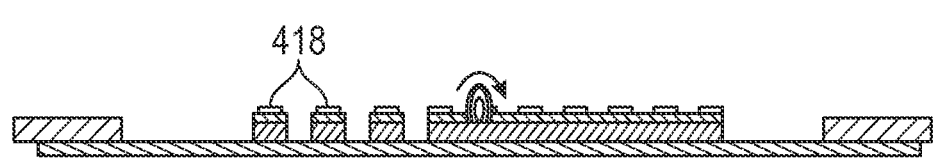
FIG. 38 is a cross sectional side view of the SOI substrate during singulating via a sawing process.
Figure 39:
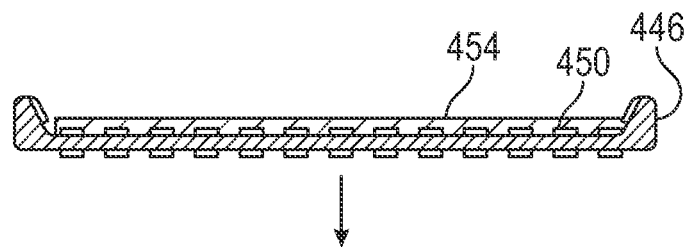
FIG. 39 is a cross sectional side view of an SOI substrate with a patterned insulative layer after forming a permanent die support thereon.

Referring to FIG. 37, the SOI substrate 410 is illustrated following demounting of the substrate, flipping of the substrate, and mounting to a dicing tape 428. The process of demounting, flipping, and mounting may be made much simpler and the process yield increased through using the permanent die support 426 to strengthen the SOI substrate 410 during these operations. Following flipping and mounting to the dicing tape 428, FIG. 38 illustrates singulating the plurality of SOI die using a sawing process. While sawing is illustrated in FIG. 38, any other singulation method disclosed in this document may be employed in various implementations.

Figure 29:
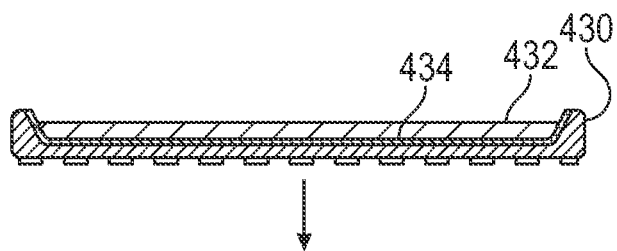
FIG. 29 is a cross sectional side view of an SOI substrate after forming a permanent die support thereon.
Figure 30:
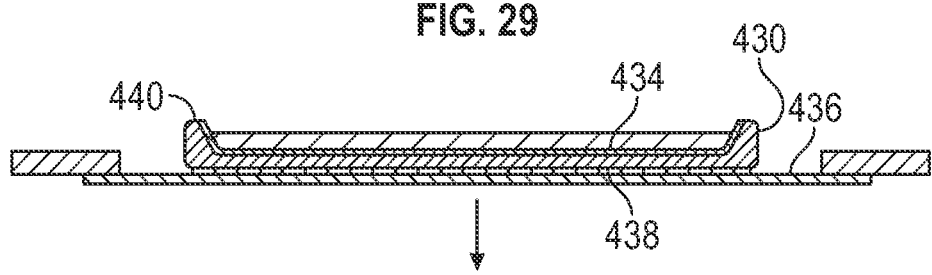
FIG. 30 is a cross sectional side view of the SOI substrate after mounting to a tape.
Figure 31:
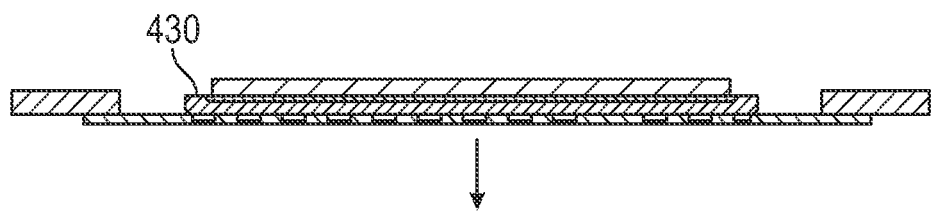
FIG. 31 is a cross sectional side view of the SOI substrate after removal of an edge ring (ring)
Figure 32:
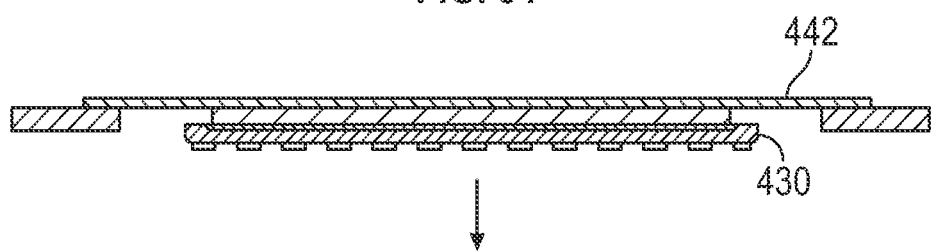
FIG. 32 is a cross sectional side view of the SOI substrate after flipping and mounting to a dicing tape.
Figure 33:
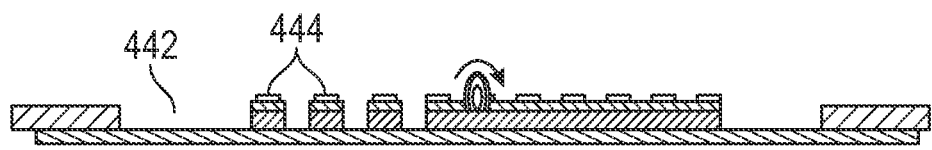
FIG. 33 is a cross sectional side view of the SOI substrate during singulating via a sawing process.

Referring to FIGS. 29-33, an implementation of an SOI substrate 430 after various steps in an implementation of a method of forming an SOI substrate is illustrated. FIG. 29 illustrates how, in this method implementation, a permanent die support 432 is coupled to the second side 434 of the SOI substrate 430 before the SOI substrate 430 is mounted to tape 436 as illustrated in FIG. 30. The permanent die support 432 may be made of any permanent die support material disclosed in this document and may be in any form of die support disclosed is this document. As previously discussed, in this method implementation, the die support 432 may be coupled to the first side 438 of the SOI substrate 430 in various method implementations instead of to the second side 434 and various combinations of an permanent and/or temporary die support may be employed in other implementations. FIG. 31 illustrates the SOI substrate 430 with the ring 440 removed (using any method of fully or partially removing a ring disclosed herein). FIG. 32 illustrates the SOI substrate 430 demounted, flipped, and mounted to a dicing tape 442. As previously discussed, the permanent die support 432 assists with providing structural support to the SOI substrate 430 during these steps. Following mounting to the dicing tape 442, FIG. 33 illustrates the singulation of the various SOI die 444 using a sawing process (though any other singulation process disclosed herein may be used).

Figure 40:
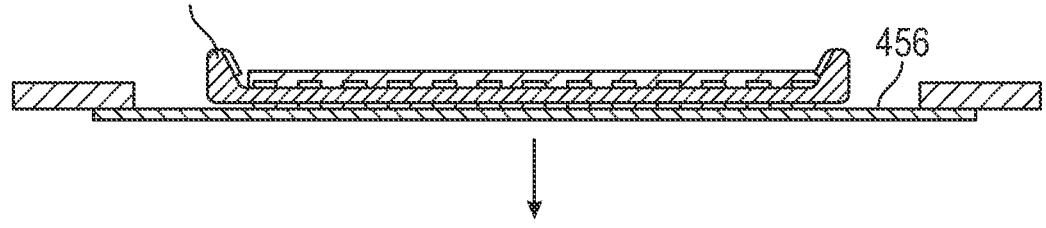
FIG. 40 is a cross sectional side view of the SOI substrate after mounting to a tape.
Figure 41:
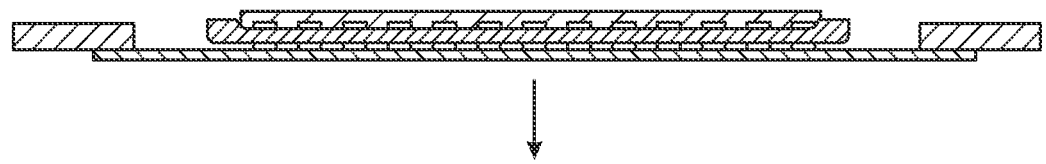
FIG. 41 is a cross sectional side view of the SOI substrate after removal of a ring.
Figure 42:
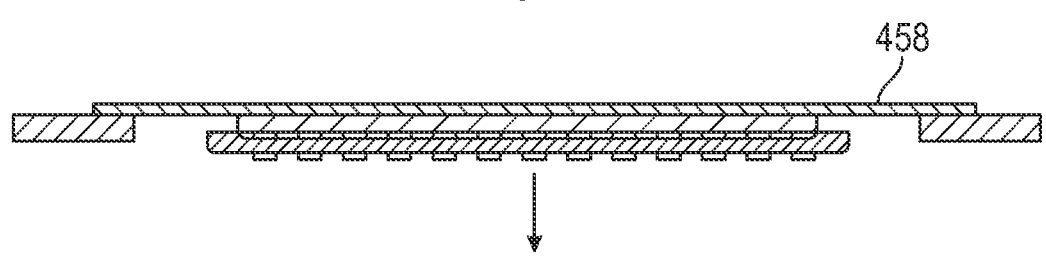
FIG. 42 is a cross sectional side view of the SOI substrate after flipping and mounting to a dicing tape.
Figure 43:
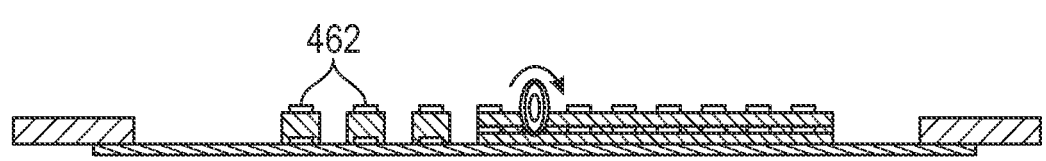
FIG. 43 is a cross sectional side view of the SOI substrate during singulating via a sawing process.

Referring to FIGS. 39-48, two implementations of SOI substrates 446, 448 are illustrated where the insulating layers 450, 452 have been patterned as previously disclosed with respect to FIGS. 28A-28E herein. In the method implementation illustrated with respect to SOI substrate 446, a permanent die support 454 is coupled to the substrate 446 before the substrate 446 is mounted on a tape 456 as illustrated in FIG. 40. As previously discussed, this permanent die support 454 may be made of any permanent die support material disclosed herein and may be in any form of a die support disclosed herein. The permanent die support 454 then supports the SOI substrate 446 during edge ring removal operations (illustrated in FIG. 41, which may involve any edge ring 460 removal process disclosed herein), demounting, flipping, and mounting onto dicing tape 458 as illustrated in FIG. 42. Finally a sawing process is used to singulate the various SOI die 462 from the SOI substrate 446 as illustrated in FIG. 43.

Figure 44:
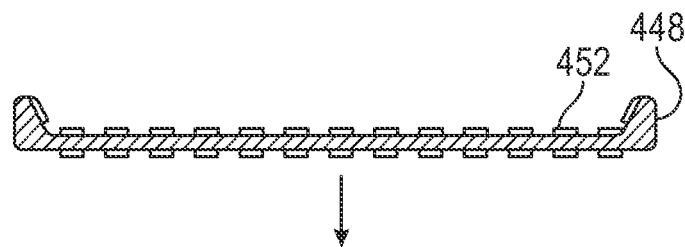
FIG. 44 is a cross sectional side view of an SOI side view with a patterned insulative layer.
Figure 45:
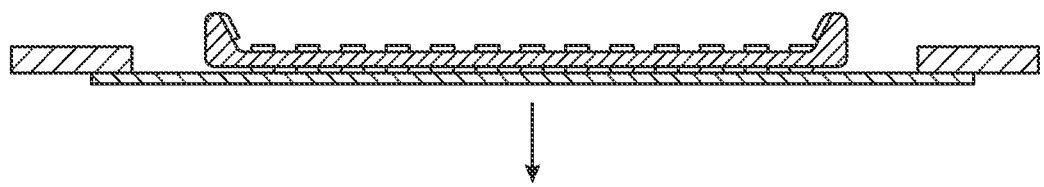
FIG. 45 is a cross sectional side view of the SOI substrate after mounting to a tape.
Figure 46:
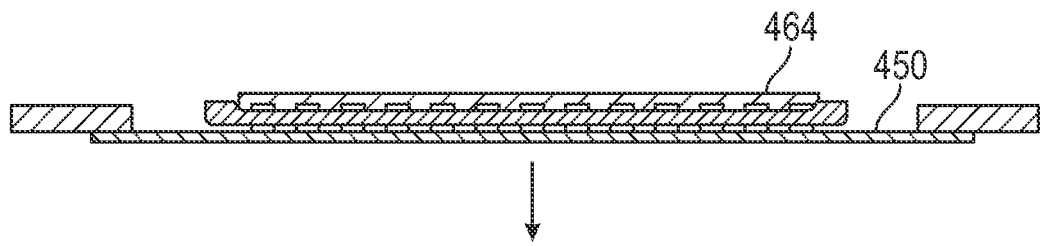
FIG. 46 is a cross sectional side view of the SOI substrate after formation of a permanent die support and removal of a ring.
Figure 47:
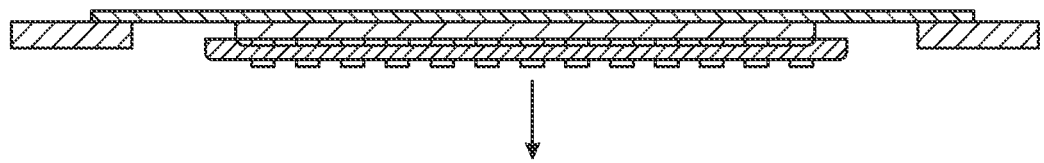
FIG. 47 is a cross sectional side view of the SOI substrate after flipping and mounting to a dicing tape.
Figure 48:
FIG. 48 is a cross sectional side view of the SOI substrate during singulating via a sawing process.

In contrast with the method implementation illustrated in FIGS. 39-43, in the implementation illustrated in FIGS. 44-48, the permanent die support 464 is not coupled to the SOI substrate 448 until the substrate 448 is mounted onto tape 450 as illustrated in FIGS. 44-46. As previously discussed, this permanent die support 464 may be made of any permanent die support material disclosed herein and may be in any form of a die support disclosed herein. The permanent die support 464 then supports the SOI substrate 448 through demounting, flipping, and mounting operations on to a dicing tape 452 and then singulation operations as illustrated in FIGS. 47-48. A wide variety of various method processing options may be employed in various implementations, particularly where multi-layer die supports, combinations of permanent and temporary die supports, and/or temporary die supports are employed with any of the SOI die and SOI substrates disclosed herein.

The various method implementations disclosed herein for forming an SOI die utilize the formation of an edge ring around the wafer/substrate to support it during the various SOI formation and processing steps. However, the use of permanent/temporary die supports may eliminate/minimize the need to use edge rings as supports. Accordingly in various method implementations, no edge ring formation or removal steps may be employed. In such implementations, the method includes thinning the second side of a silicon substrate using any of the various thinning methods disclosed herein. The method then includes depositing an insulative layer onto the second side of the silicon substrate. The insulative layer may be any disclosed herein and may include any insulative material disclosed in this document. In various other implementations, the method may also include depositing a conductive material onto the second side of the silicon substrate either before depositing the insulative layer or afterward. The conductive material may be any disclosed herein and may be deposited using any method disclosed herein. The method also includes forming a permanent die support, a temporary die support or a combination of permanent and temporary die supports and coupling them with the second side of the silicon substrate. In various implementations, the die support material is coupled to the insulative layer. The permanent and/or temporary die supports may be any disclosed in this document and may be made of any material disclosed in this document for a permanent and/or temporary die support. The method then includes singulating the silicon substrate into a plurality of SOI die. In various method implementations, the conductive layer may be patterned. As previously discussed, the method may not include implanting hydrogen. Also, the use of stress relief etching following the thinning operation may be utilized in various method implementations as previously discussed. Any of the other previously discussed SOI die formation method options and materials for the various layers disclosed herein may be employed in various method implementations.

A wide variety of methods and processes may be employed to remove the temporary die supports from the SOI die at the point in the process where the temporary supports are no longer needed. Various implementations of a temporary die supports may be peeled off of the surface of the SOI die after or during exposure from a light source. This light source may be, by non-limiting example, a visible light source, an infrared light source, an ultraviolet light source, a laser light source, or any other source of light capable of acting to release or assist in releasing the temporary die support. For example, if the temporary die support was a UV release tape, then the support could be peeled from the surface of the SOI die following exposure to a UV light source for a predetermined period of time after the SOI die had been attached to, by non-limiting example, a substrate, leadframe, another die, a lead, a redistribution layer, any combination thereof, or any other die bonding structure.

In various implementations, temporary die supports may be etched from an SOI die using a plasma etching source. While a plasma etching source may be used, any other etching process could be employed in various implementations, including, by non-limiting example, a wet etching process, a spray etching process, a reactive ion etching process, an ion bombardment process, a lasering process, a grinding process, or any other process capable of reacting away or ablating the material of the temporary die support.

In other implementations, the temporary die support may be removed using energy assisting processes. In various implementations, a temporary die support may be separated from an SOI die in a bath under ultrasonic energy produced by ultrasonic energy source. Under the influence of the compression waves in the fluid of the bath, the temporary die support may separate without requiring any pulling force, or the peeling of the temporary die support may be enabled by the ultrasonic energy. While the use of a bath may be used, in various implementations a puddle may be used. In still other implementations, the ultrasonic energy may be directly or indirectly applied to the SOI die through a spindle, a chuck, a plate, or a liquid stream. In various implementations, the source of sonic energy may range from about 20 kHz to about 3 GHz. Where the sonic frequencies utilized by the ultrasonic energy source are above 360 kHz, the energy source may also be referred to as a megasonic energy source. In particular implementations, the sonic energy source may generate ultrasonic vibrations at a frequency of 40 kHz at a power of 80 W. In various implementations, the sonic energy source may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

In various semiconductor package and method implementations disclosed in this document, any of the pads or electrical connectors disclosed in this document for the SOI die may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

In places where the description above refers to particular implementations of SOI die support structures and implementing components, sub-components, methods and sub-methods, it should be readily apparent that a number of modifications may be made without departing from the spirit thereof and that these implementations, implementing components, sub-components, methods and sub-methods may be applied to other SOI die support structures and related methods.

What is claimed is:

1. A silicon-in-insulator (SOI) semiconductor die comprising:
a first largest planar surface, a second largest planar surface and a thickness between the first largest planar surface and the second largest planar surface; and
a permanent die support structure and a temporary die support structure directly coupled to one of the first largest planar surface, the second largest planar surface, the thickness, or any combination thereof;
wherein the first largest planar surface, the second largest planar surface, and the thickness are formed of a conductive layer directly coupled onto a silicon layer and an insulative layer coupled over the conductive layer.

2. The die of claim 1, wherein a warpage of one of the first largest planar surface or the second largest planar surface is less than 200 microns.

3. The die of claim 1, wherein the conductive layer comprises titanium.

4. The die of claim 1, wherein the conductive layer is patterned.

5. The die of claim 1, wherein the permanent die support structure comprises a mold compound.

6. The die of claim 1, further comprising a third die support structure coupled to one of the first largest planar surface, the second largest planar surface, the thickness, or any combination thereof.

7. A silicon-in-insulator (SOI) semiconductor die comprising:
- a first largest planar surface, a second largest planar surface and a thickness between the first largest planar surface and the second largest planar surface; and
- a permanent die support structure and a temporary die support structure directly coupled to the first largest planar surface;

wherein the first largest planar surface, the second largest planar surface, and the thickness are formed by a silicon layer and an insulative layer coupled over the silicon layer; and wherein one of the permanent die support structure or temporary die support structure is directly coupled to both the insulative layer and the silicon layer.

8. The die of claim 7, wherein a warpage of one of the first largest planar surface or the second largest planar surface is less than 200 microns.

9. The die of claim 7, wherein the thickness is between 0.1 microns and 125 microns.

10. The die of claim 7, wherein a perimeter of the SOI semiconductor die is rectangular and a size of the SOI semiconductor die is at least 6 mm by 6 mm.

11. The die of claim 7, wherein the permanent die support structure comprises a mold compound.

\* \* \* \* \*